(12) United States Patent
Manack et al.

(10) Patent No.: US 10,566,267 B2
(45) Date of Patent: Feb. 18, 2020

(54) DIE ATTACH SURFACE COPPER LAYER WITH PROTECTIVE LAYER FOR MICROELECTRONIC DEVICES

(71) Applicant: Texas Instruments Incorporated, Dallas, TX (US)

(72) Inventors: Christopher Daniel Manack, Flower Mound, TX (US); Nazila Dadvand, Richardson, TX (US); Salvatore Frank Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/984,343

(22) Filed: May 19, 2018

(65) Prior Publication Data

US 2019/0109074 A1      Apr. 11, 2019

Related U.S. Application Data

(60) Provisional application No. 62/568,463, filed on Oct. 5, 2017.

(51) Int. Cl.
| | |
|---|---|
| *H01L 23/495* | (2006.01) |
| *H01L 23/49* | (2006.01) |
| *H01L 23/492* | (2006.01) |
| *H01L 23/532* | (2006.01) |
| *H01L 23/00* | (2006.01) |

(52) U.S. Cl.
CPC ........ *H01L 23/49517* (2013.01); *H01L 23/49* (2013.01); *H01L 23/492* (2013.01); *H01L 23/53238* (2013.01); *H01L 24/03* (2013.01); *H01L 24/08* (2013.01)

(58) Field of Classification Search
CPC ..... H01L 23/482; H01L 23/49; H01L 23/492; H01L 23/49513; H01L 23/49517; H01L 23/49524; H01L 23/49562; H01L 23/53238; H01L 24/03; H01L 24/08
See application file for complete search history.

(56) References Cited

U.S. PATENT DOCUMENTS

| | | |
|---|---|---|
| 8,497,206 B2 | 7/2013 | Hua et al. |
| 9,057,141 B2 | 6/2015 | Barz et al. |
| 9,252,054 B2 | 2/2016 | Wu et al. |

(Continued)

OTHER PUBLICATIONS

International Search Report for PCT/US 2018/054415 dated Jan. 17, 2019.

*Primary Examiner* — Joseph M Galvin, III
(74) *Attorney, Agent, or Firm* — Dawn Jos; Charles A. Brill; Frank D. Cimino

(57) ABSTRACT

A microelectronic device is formed by thinning a substrate of the microelectronic device from a die attach surface of the substrate, and forming a copper-containing layer on the die attach surface of the substrate. A protective metal layer is formed on the copper-containing layer. Subsequently, the copper-containing layer is attached to a package member having a package die mount area. The protective metal layer may optionally be removed prior to attaching the copper-containing layer to the package member. Alternatively, the protective metal layer may be left on the copper-containing layer when the copper-containing layer is attached to the package member. A structure formed by the method is also disclosed.

20 Claims, 17 Drawing Sheets

(56) References Cited

U.S. PATENT DOCUMENTS

| | | |
|---|---|---|
| 9,252,128 B2 | 2/2016 | Chandrasekaran |
| 9,330,943 B2 | 5/2016 | Arnold |
| 9,390,968 B2 | 7/2016 | Li |
| 2003/0035269 A1 | 2/2003 | Chiu |
| 2006/0214286 A1* | 9/2006 | Sir .......................... H01L 23/36 |
| | | 257/720 |
| 2007/0040237 A1* | 2/2007 | Coyle ................. H01L 23/3107 |
| | | 257/531 |
| 2008/0277779 A1 | 11/2008 | Gupta et al. |
| 2011/0201192 A1 | 8/2011 | Hua et al. |
| 2011/0312131 A1 | 12/2011 | Renavikar et al. |
| 2012/0148733 A1 | 6/2012 | Arnd et al. |
| 2013/0295763 A1 | 11/2013 | Li |
| 2014/0112363 A1* | 4/2014 | Feitisch ............... B23K 20/023 |
| | | 372/43.01 |
| 2014/0159214 A1 | 6/2014 | Arnold |
| 2015/0372192 A1* | 12/2015 | Epler ...................... H01L 33/16 |
| | | 257/76 |
| 2016/0204047 A1* | 7/2016 | Sugiura ............... B23K 1/0016 |
| | | 257/712 |
| 2016/0300743 A1 | 10/2016 | Li |
| 2017/0338169 A1* | 11/2017 | Mahler ............... H01L 23/3135 |
| 2017/0345807 A1* | 11/2017 | Yu ....................... H01L 23/5389 |
| 2018/0061744 A1* | 3/2018 | Railkar ................. B81B 7/0061 |

\* cited by examiner

DIE ATTACH SURFACE COPPER LAYER WITH PROTECTIVE LAYER FOR MICROELECTRONIC DEVICES

CROSS-REFERENCE TO RELATED APPLICATIONS

This application claims the benefit of priority under 35 U.S.C. § (119)(e) of U.S. Provisional Application No. 62/568,463, filed Oct. 5, 2017, which is hereby incorporated by reference in its entirety.

FIELD OF THE DISCLOSURE

This disclosure relates to the field of microelectronic devices. More particularly, this disclosure relates to metal layers in microelectronic devices.

BACKGROUND OF THE DISCLOSURE

Some microelectronic devices have metal layers on the die attach surfaces of their substrates, to provide low resistance electrical or thermal connections. Copper is a desirable element for the metal layers, due to copper's high electrical and thermal conductivities. However, copper on the die attach surfaces of the substrates presents contamination, oxidation, and corrosion issues. Integration of copper layers on the die attach surfaces has been challenging to integrate into fabrication flows for the microelectronic devices.

SUMMARY OF THE DISCLOSURE

The present disclosure introduces a method of forming a microelectronic device which involves the steps of thinning a substrate of the microelectronic device from a die attach surface of the substrate, forming a copper-containing layer on the die attach surface of the substrate, forming a protective metal layer on the copper-containing layer, and subsequently attaching the copper-containing layer to a package member at a package die mount area. The protective metal layer may optionally be removed prior to attaching the copper-containing layer to the package member. A structure formed by the method is also disclosed.

DETAILED DESCRIPTION OF EXAMPLE EMBODIMENTS

Figure 1:
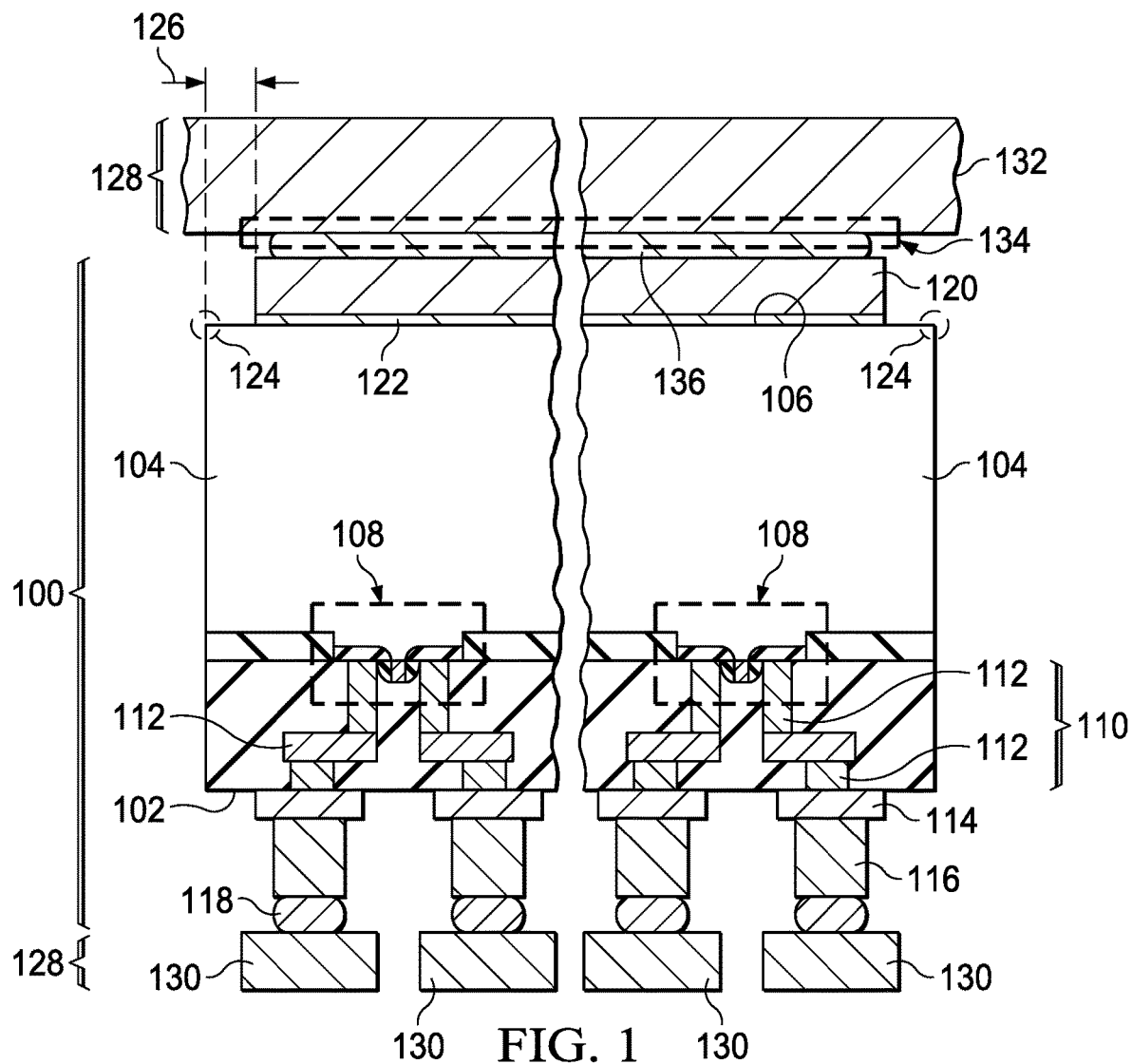
FIG. 1 is a cross section of an example microelectronic device assembled in a package.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a component surface with components located proximate to the component surface, and input/output (I/O) pads extending to the component surface. The microelectronic device further has a substrate with a die attach surface opposite from the component surface. The microelectronic device may be formed by thinning the substrate from the die attach surface while the microelectronic device is contained in a substrate wafer, such as a silicon wafer. The substrate may be thinned to reduce a thermal or electrical resistance from the components to the die attach surface.

After the substrate is thinned, a copper-containing layer is formed on the die attach surface while the microelectronic device is contained in the substrate wafer. An intermediate layer may be formed on the die attach surface prior to forming the copper-containing layer, so that the intermediate layer separates the copper-containing layer from the die attach surface of the substrate. In one aspect, the intermediate layer may provide better adhesion between the copper-containing layer and the die attach surface than would be provided by having the copper-containing layer directly on the die attach surface. In another aspect, the intermediate layer may provide a barrier to copper from the copper-containing layer diffusing into the substrate. Copper has undesired effects when diffusing into some substrate materials such as semiconductor materials. The copper-containing layer may be formed so as to be recessed from a lateral perimeter of the die attach surface. Recessing the copper-containing layer may advantageously reduce copper contamination of the substrate during subsequent singulation of the microelectronic device.

A protective metal layer is formed on the copper-containing layer, while the microelectronic device is contained in the substrate wafer. The protective metal layer may include, for example, tin, silver, nickel, cobalt, tungsten, molybdenum, cerium, lanthanum, or any combination thereof. The protective metal layer may be formed by an immersion plating process, or by an electroplating process. The protective metal layer may advantageously protect the copper-containing layer from corrosion or oxidation during subsequent fabrication processes.

The microelectronic device is subsequently singulated to separate the microelectronic device from the rest of the substrate wafer. Some time may elapse before and after singulation, before the microelectronic device is assembled into a package such as a lead frame package. The protective metal layer may advantageously protect the copper-containing layer from corrosion or oxidation.

Prior to assembly, the protective metal layer may be removed by a wet etch process, leaving the copper-containing layer intact and providing a clean surface for a subsequent die attach process. The microelectronic device is assembled into a package by the die attach process, in which the copper-containing layer is attached to a package die mount area by a solder process, an adhesive process, or by another process. Providing a clean surface of the copper-containing layer may advantageously provide a lower thermal or electrical resistance between the package die mount area and the components of the microelectronic device.

Alternatively, a portion or all of the protective metal layer may be left in place on the copper-containing layer during the die attach process. The protective metal layer may be cleaned, for example by a wet etch process, prior to the die attach process. The protective metal layer may provide a suitable surface for solder or adhesive die attach material. Leaving at least a portion of the protective metal layer on the copper-containing layer may reduce process cost and complexity for the microelectronic device.

Thinning the substrate places restrictions on a thickness of the copper-containing layer. The copper-containing layer should be sufficiently thick to provide a low thermal or electrical resistance between the package die mount area and the substrate. The copper-containing layer should not be so thick as to warp or distort the substrate due to stress in the copper-containing layer. To meet these restrictions, the copper-containing layer may be, for example, 5 microns to 10 microns thick. The protective metal layer prevents consumption of copper in the copper-containing layer from corrosion or oxidation, so that the microelectronic device may be attached to the package die mount area without a significant reduction, that is, less than a micron reduction, of the thickness of the copper-containing layer.

For the purposes of this disclosure, it will be understood that, if an element is referred to as being "on" another element, it may be directly on the other element, or intervening elements may be present. If an element is referred to as being "directly on" another element, it is understood there are no other intentionally disposed intervening elements present.

FIG. 1 is a cross section of an example microelectronic device assembled in a package. The microelectronic device 100 has a component surface 102 and a substrate 104 with a die attach surface 106 located opposite from the component surface 102. The substrate 104 may include silicon, gallium arsenide, gallium nitride, or other semiconductor material. The microelectronic device 100 includes components 108, depicted in FIG. 1 as metal oxide semiconductor (MOS) transistors 108, located proximate to the component surface 102. The substrate 104 may be at least 15 microns thick to provide mechanical support for the components 108. The substrate 104 may be less than 300 microns thick, to reduce an electrical or thermal resistance from the components 108 to the die attach surface 106. In the instant example, the microelectronic device 100 includes an interconnect region 110 extending from the components 108 to the component surface 102. Interconnection members 112 such as contacts, interconnects, and vias, in the interconnect region 110, electrically connect the components 108 to I/O pads 114 located at the component surface 102. In the instant example, the microelectronic device 100 includes copper-containing pillars 116 coupled to the I/O pads 114 and solder balls 118 coupled to the copper-containing pillars 116.

The microelectronic device 100 includes a copper-containing layer 120 on the die attach surface 106. The microelectronic device 100 of the instant example includes an intermediate layer 122 between the copper-containing layer 120 and the die attach surface 106. In another manifestation of the microelectronic device 100, the copper-containing layer 120 may be disposed directly on the die attach surface 106. The copper-containing layer 120 may include essentially only copper, or may include other materials such as organic materials and oxygen, in minor amounts, which may be incorporated during a plating process used to form the copper-containing layer 120. The copper-containing layer 120 may include small amounts of another metal. The copper-containing layer 120 may be, for example, 5 microns to 10 microns thick. The intermediate layer 122 may provide better adhesion between the copper-containing layer 120 and the die attach surface 106 than would be attained by having the copper-containing layer 120 directly on the die attach surface 106. The intermediate layer 122 may provide a barrier to diffusion of copper from the copper-containing layer 120 into the substrate 104. The intermediate layer 122 may include, for example, titanium, titanium tungsten, nickel, or chromium, and may be 50 nanometers to 500 nanometers thick.

The copper-containing layer 120 may be recessed from a lateral perimeter 124 of the die attach surface 106. Having the copper-containing layer 120 recessed from the lateral perimeter 124 may advantageously reduce copper contamination in the substrate 104 during a singulation process, such as sawing or laser scribing, that separates the microelectronic device from a substrate wafer. The copper-containing layer 120 may be recessed by a lateral distance 126 of 5 microns to 50 microns, for example, to provide tolerance for positional and dimensional variations in the singulation process. The intermediate layer 122, if present, may also be recessed from the lateral perimeter 124.

The microelectronic device 100 is attached to a package 128, which may be manifested as a lead frame 128 with leads 130 and a package member 132, depicted as a clip 132 in FIG. 1. The solder balls 118 may be directly attached to the leads 130, and the copper-containing layer 120 may be attached to the clip 132 in a package die mount area 134 by a die attach material 136, which may be manifested as a solder layer 136. The copper-containing layer 120 may provide strong and uniform solder connection to the solder layer 136 and so provide a low thermal or electrical resistance between the clip 132 and the substrate 104. The copper-containing layer 120 may be 5 microns to 10 microns thick, for example, to provide a desired balance between limiting stress in the thinned substrate 104 and making a strong and uniform solder connection to the solder layer 136. The copper-containing layer 120 may have a non-uniformity less than 1 percent across the die attach surface 106, which may be indicative of a protective metal layer applied to the copper-containing layer 120 to protect against oxidation and corrosion. Removal of oxidation and corrosion frequently result in thickness variations greater than 1 percent in an underlying copper layer.

Figure 2A:
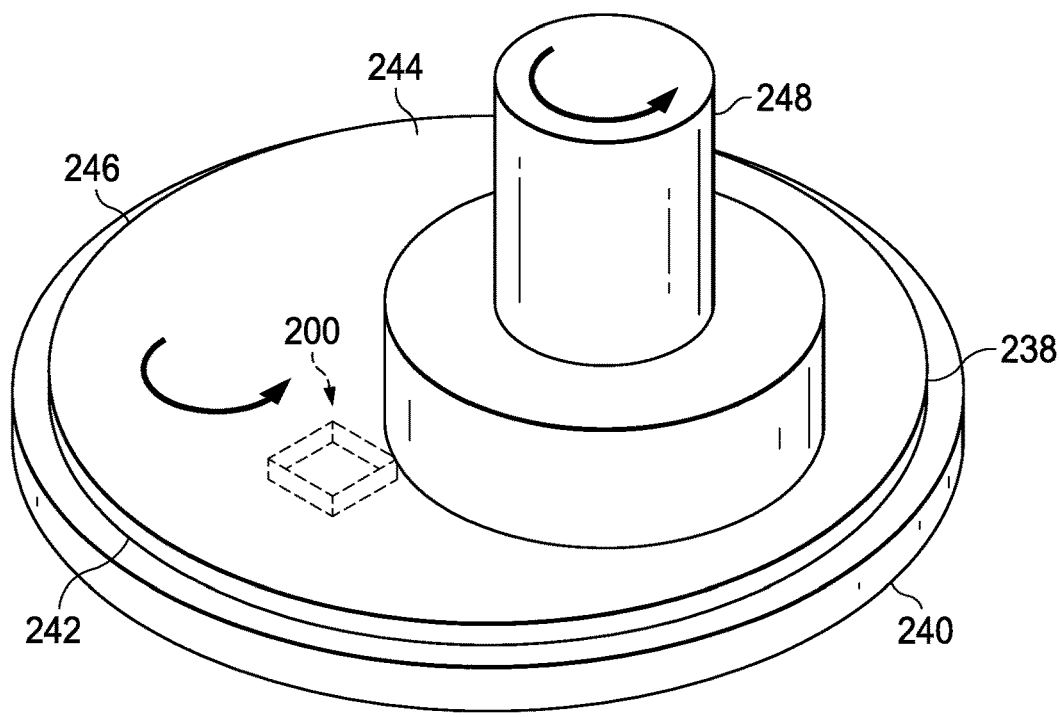
FIG. 2A through FIG. 2I are views of a microelectronic device, depicted in stages of an example method of formation.

FIG. 2A through FIG. 2I are views of a microelectronic device, depicted in stages of an example method of formation. Referring to FIG. 2A, the microelectronic device 200 is contained in a substrate wafer 238. The substrate wafer 238 may be implemented as a semiconductor wafer such as a silicon wafer, a gallium arsenide wafer, or a gallium nitride wafer. The substrate wafer 238 may optionally be mounted on a carrier plate 240, as depicted in FIG. 2A. Alternatively, the substrate wafer 238 may optionally be mounted on a tape or may have a protective coating. The substrate wafer 238 has a component face 242 facing the carrier plate 240, and a substrate 244 with a die attach face 246 located opposite from the component face 242. The substrate 244 includes a semiconductor material, such as silicon, gallium arsenide, or gallium nitride.

Material is removed from the substrate 244 at the die attach face 246 using a backgrind tool 248 in a backgrind operation. A thickness of the substrate 244 is reduced by the backgrind operation, to reduce an electrical or a thermal resistance of the substrate 244. The thickness of the substrate 244 prior to performing the backgrind operation may be greater than 600 microns, to provide mechanical stability during fabrication of components 208, shown in FIG. 2C.

The thickness of the substrate 244 may be reduced to 15 microns to 300 microns, which may provide a desired balance between the electrical or thermal resistance of the substrate 244 and durability of the substrate 244 in subsequent fabrication operations. Removing the material from the substrate 244 at the die attach face 246 may introduce mechanical stress in the substrate wafer 238, risking damage to the substrate 244. The substrate 244 may be separated from the carrier plate 240 by wire bond pads or bump bond structures at the component face 242; the wire bond pads or bump bond structures may be distributed non-uniformly across the component face 242, providing inadequate support for the substrate wafer 238. In such cases, extra wire bond pads or bump bond structures, sometimes referred to as dummy wire bond pads or bump bond structures, may be formed on the substrate wafer 238 to provide a more uniform support, enabling safe removal of the material from the substrate 244. The extra wire bond pads or bump bond structures may enable attaining a thickness of the substrate 244 that is less than could be attained without the extra wire bond pads or bump bond structures.

Figure 2B:
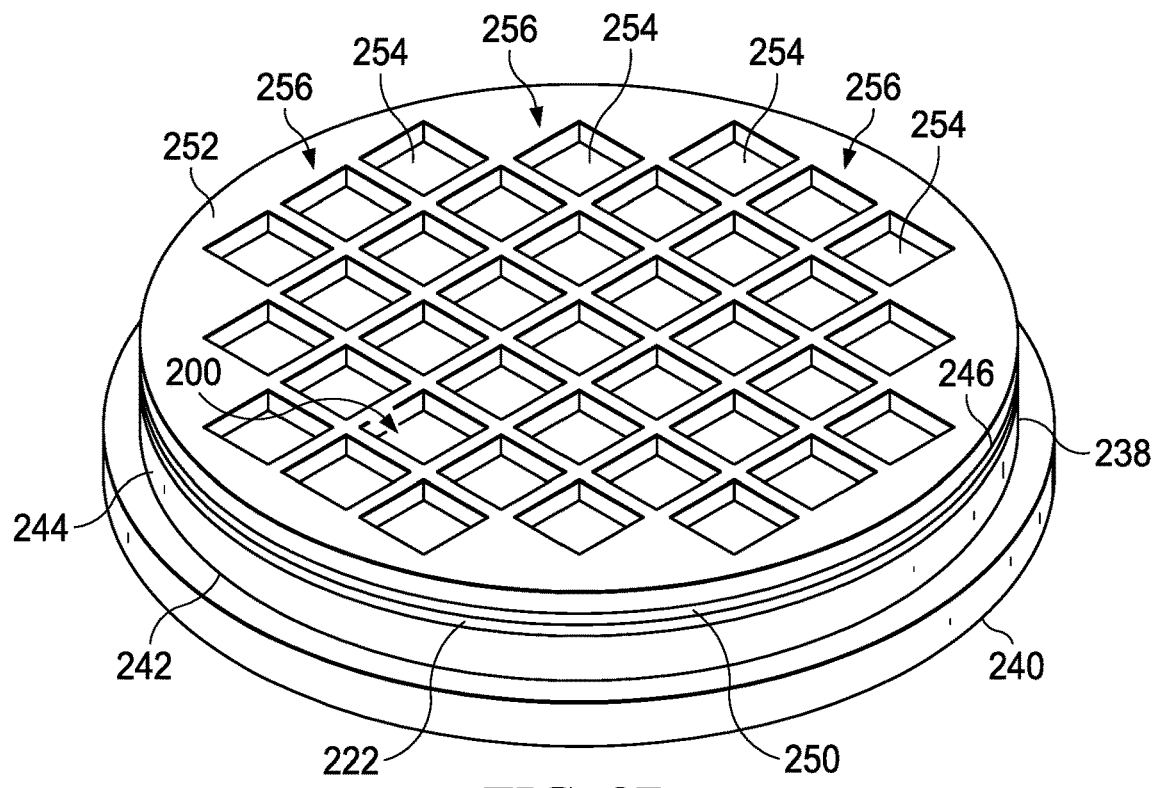

Referring to FIG. 2B, an optional intermediate layer 222 may be formed on the die attach face 246 of the substrate 244. The intermediate layer 222 may have adhesion or diffusion barrier properties, as disclosed in reference to the intermediate layer 122 of FIG. 1. The intermediate layer 222 may be formed by a sputter process, for example. A seed layer 250 is formed on the intermediate layer 222, if present, or on the die attach face 246 of the substrate 244, if the intermediate layer 222 is not present. The seed layer 250 includes a metal suitable for subsequent plating of copper. For example, the seed layer 250 may include a copper layer. The seed layer 250 is sufficiently thick to distribute electrical current during the subsequent plating of copper without undue debiasing, and is sufficiently thin to enable subsequent removal without significant reduction of the plated copper. The seed layer 250 may be formed by a sputter process, for example.

A plating mask 252 is formed over the seed layer 250. The plating mask 252 has openings 254 which expose the seed layer 250 in areas for the microelectronic device 200 and similar microelectronic devices 256 contained in the substrate wafer 238. The plating mask 252 covers areas for singulation regions between the areas for the microelectronic device 200 and the similar microelectronic devices 256. The plating mask 252 may include photoresist and may be formed by a photolithographic process. Alternatively, the plating mask 252 may include photo-insensitive polymer material and may be formed by an additive process such as an ink jet process. Forming the plating mask on the substrate wafer 238 after the substrate wafer 238 has been thinned may require special handling and support, to avoid damaging the substrate 244. For example, the substrate wafer 238 may be left on the carrier plate 240, as depicted in FIG. 2B. The substrate wafer 238 may be mounted on a different carrier plate that is appropriate for the process of forming the plating mask 252, which may be a photolithographic process involving coating the substrate wafer 238 with photoresist by a spin-coat operation.

Figure 2C:
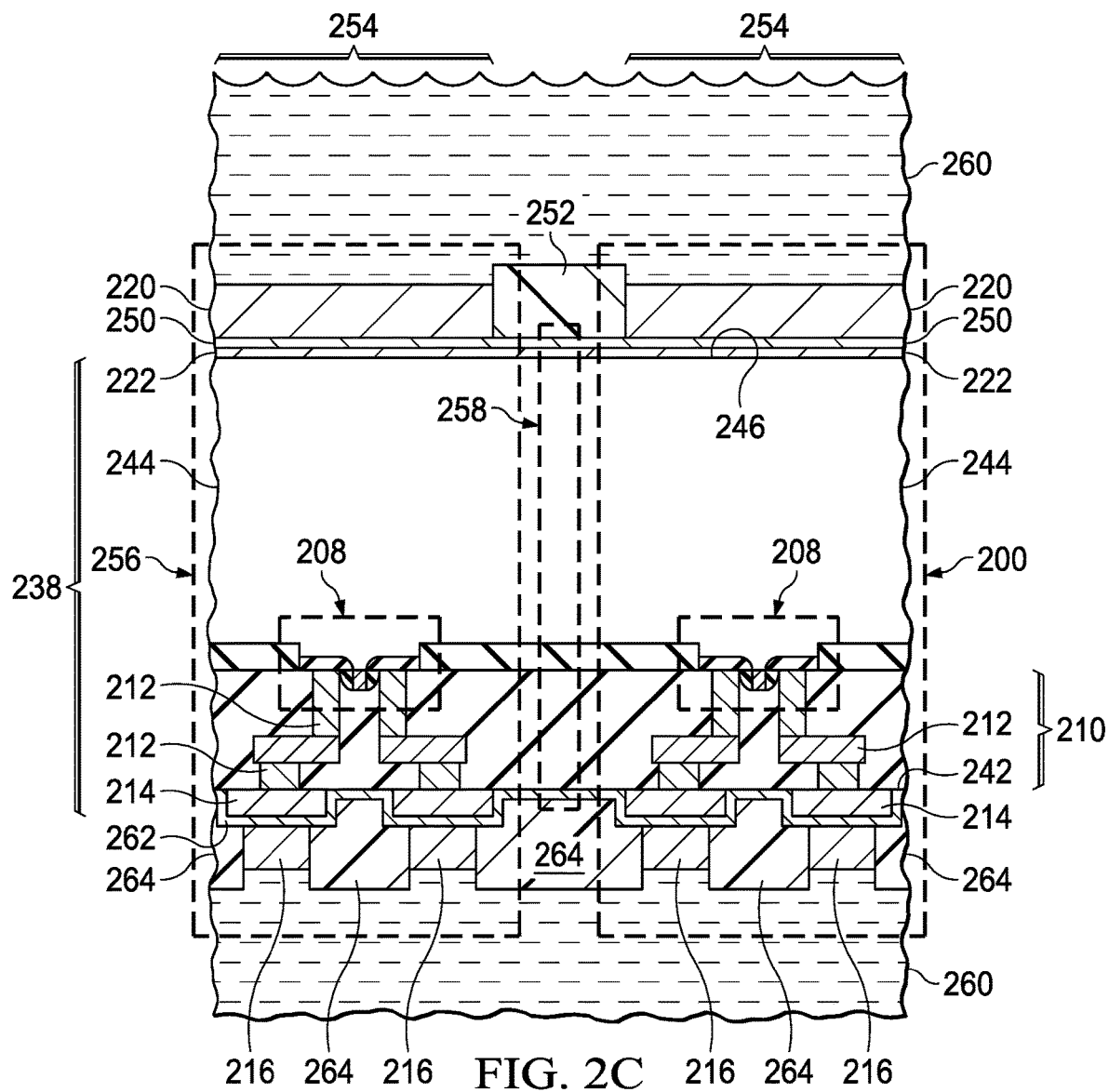

Referring to FIG. 2C, the substrate wafer 238 is shown in cross section at a boundary between the microelectronic device 200 and an adjacent instance of the similar microelectronic devices 256. The microelectronic device 200 and the similar microelectronic device 256 include the components 208 located proximate to the component face 242, and interconnect regions 210 extending from the components 208 to the component face 242. The microelectronic device 200 and the similar microelectronic device 256 may include interconnection members 212 in the interconnect regions 210 to electrically connect the components 208 to I/O pads 214 located at the component face 242.

The plating mask 252 covers the seed layer 250 over a singulation region 258 located between the microelectronic device 200 and the similar microelectronic device 256. The plating mask 252 extends into areas for the microelectronic device 200 and the similar microelectronic device 256, so as to recess a subsequently-formed copper-containing layer from the singulation region 258. The openings 254 in the plating mask 252 expose the seed layer 250 in the areas for the microelectronic device 200 and the similar microelectronic device 256.

The seed layer 250 is exposed to a copper plating bath 260 in the openings 254 in the plating mask 252. A copper-containing layer 220 is formed on the microelectronic device 200 and on the similar microelectronic device 256 where exposed by the plating mask 252 by a plating process such as an electroplating process, or an electroless plating process, which plates copper on the seed layer 250. The copper plating bath 260 includes copper, and may include additives such as levelers, brighteners, or inhibitors, to improve the uniformity of the copper-containing layer 220. A thickness of the copper-containing layer 220 may be selected to provide a low thermal or electrical resistance connection to the substrate 244 without warping or distorting the substrate 244. The copper-containing layer 220 may be, for example, 5 microns to 10 microns thick.

An under bump metal (UBM) layer 262 may optionally be formed on the component face 242 and extending over the I/O pads 214. A pillar plating mask 264 may optionally be formed on the UBM layer 262, exposing areas for copper-containing pillars 216. The UBM layer 262 may be exposed to the copper plating bath 260, and at least a portion of the copper-containing pillars 216 may be formed concurrently with the copper-containing layer 220. A final thickness of the copper-containing pillars 216 may be greater than a thickness of the copper-containing layer 220, and so a remaining portion of the copper-containing pillars 216 may be formed in a subsequent plating operation, along with a plating process to form solder balls, not shown in FIG. 2C, on the copper-containing pillars 216.

The plating mask 252 is subsequently removed, leaving the copper-containing layer 220 in place on the seed layer 250. The pillar plating mask 264 may be removed concurrently with removal of the plating mask 252. The plating mask 252 and the pillar plating mask 264 may be removed, for example, by an oxygen dry etch process such as an ash process or an ozone process.

Figure 2D:
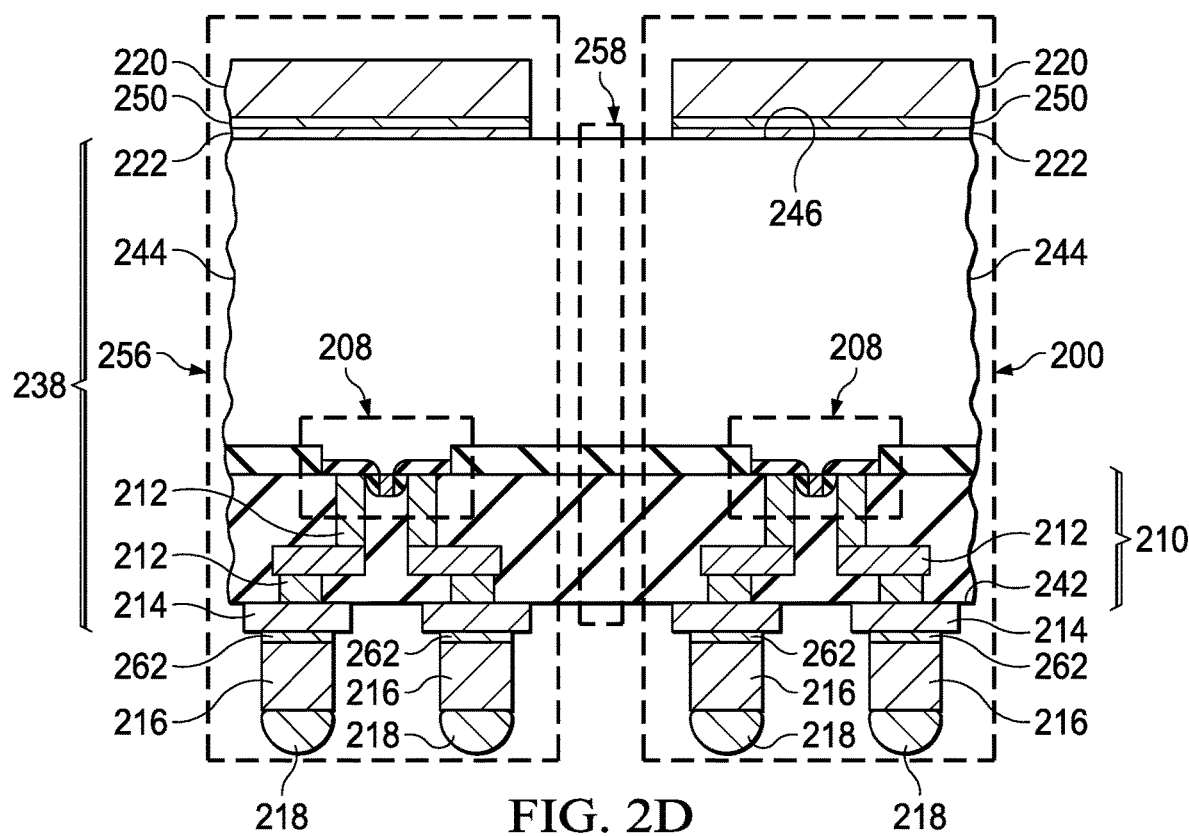

Referring to FIG. 2D, the seed layer 250 may be removed from the singulation region 258 to reduce contamination of the substrate 244 by copper in the seed layer 250 during a subsequent singulation process. The seed layer 250 may be removed from the singulation region 258 by removing the seed layer 250 where exposed by the copper-containing layer 220. The seed layer 250 may be removed by a timed wet etch process, for example. The intermediate layer 222, if present, may also be removed from the singulation region 258 to reduce contamination of the substrate 244. The UBM layer 262 is removed where exposed by the copper-containing pillars 216, leaving the UBM layer 262 in place between the I/O pads 214 and the copper-containing pillars 216. The solder balls 218 on the copper-containing pillars 216 provide bump bond structures for the microelectronic device 200.

Figure 2E:
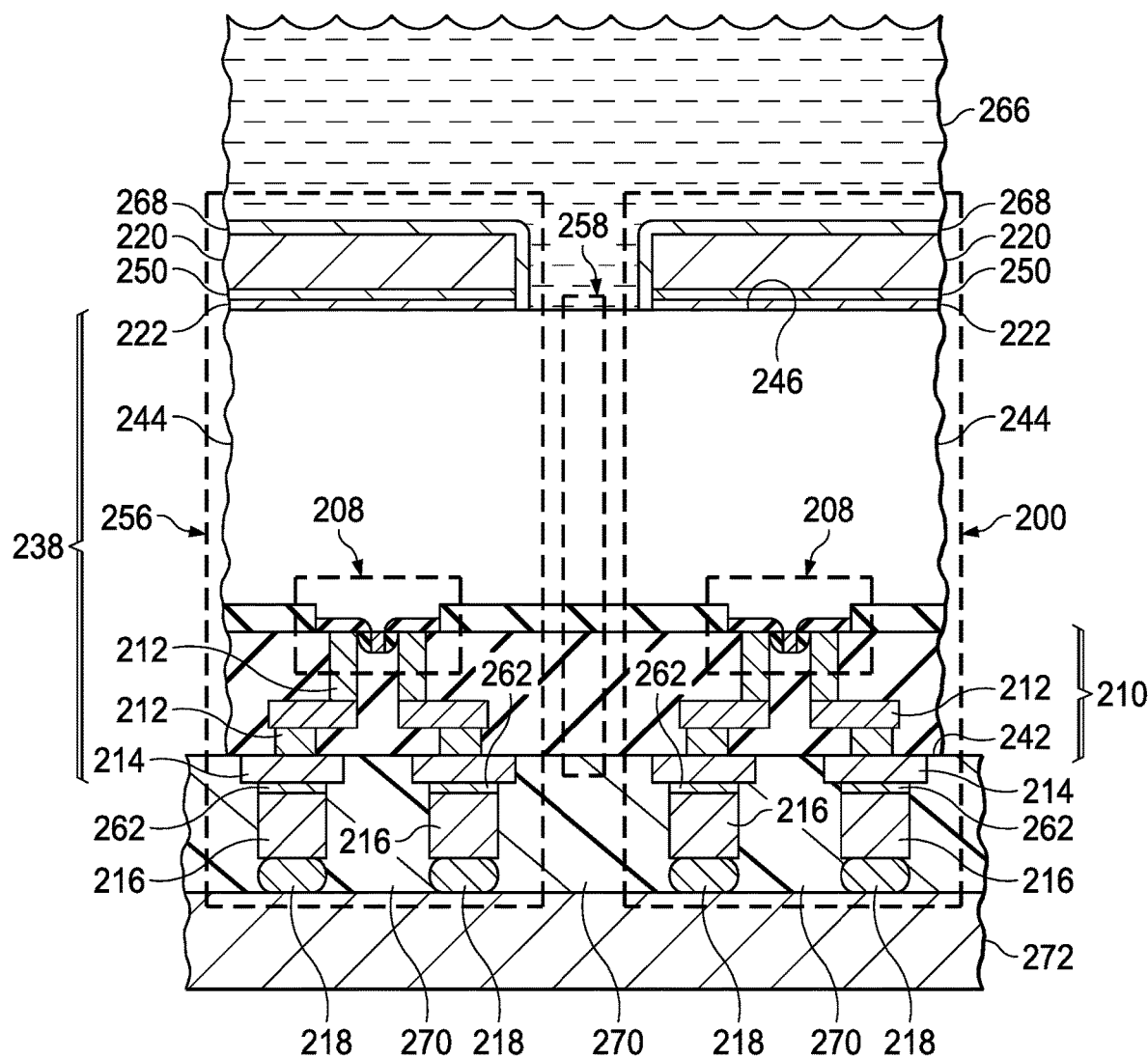

Referring to FIG. 2E, the copper-containing layer 220 is exposed to an electroless plating bath 266, which forms a protective metal layer 268 on the copper-containing layer 220. The protective metal layer 268 has a composition which protects the copper-containing layer 220 from corrosion or oxidation. The electroless plating bath 266 may include, for example, tin, silver, nickel, or any combination thereof.

A version of the electroless plating bath 266 including tin may have stannous chloride (at about 3.8 grams per liter of $H_2O$), thiourea (at about 49.5 grams per liter of $H_2O$), and sulfuric acid (at about 12 milliliters per liter of $H_2O$), and maintained at 25° C. to 50° C. during formation of the protective metal layer 268.

A version of the electroless plating bath 266 including silver may have silver nitrate (at about 10 grams per liter of $H_2O$), 25% aqueous ammonium hydroxide (at about 100 milliliters per liter of $H_2O$), and sodium thiosulfate (at about 100 grams per liter of $H_2O$), and maintained at about 50° C. during formation of the protective metal layer 268.

A version of the electroless plating bath 266 including nickel may have nickel chloride (at about 20 grams per liter of $H_2O$), sodium hypophosphite (at about 15 grams per liter of $H_2O$), acetic acid (at about 20 milliliters per liter of $H_2O$), malic acid (at about 20 grams per liter of $H_2O$), glycine (at about 5 grams per liter of $H_2O$), and boric acid (at about 2 grams per liter of $H_2O$), and may have a pH adjusted to 6.5 to 6.7 by addition of sodium hydroxide or hydrochloric acid, as needed, and may be maintained at about 70° C. during formation of the protective metal layer 268.

Chemicals for proprietary formulations of the electroless plating bath 266 are commercially available from various suppliers. One version of the electroless plating bath 266 may include one of the metals tin, silver, or nickel, and essentially no other metals, to reduce cost and complexity of the electroless plating bath 266. Another version of the electroless plating bath 266 may include both tin and silver, which may reduce formation of tin whiskers and may provide more robust protection than tin, at less cost than silver. A further version of the electroless plating bath 266 may include nickel to provide a more durable version of the protective metal layer 268.

The protective metal layer 268 may be, for example, 0.5 microns to 5 microns thick, depending on the formulation of the electroless plating bath 266, the temperature of the electroless plating bath 266, and the time the copper-containing layer 220 is exposed to the electroless plating bath 266. Using the electroless plating bath 266 to form the protective metal layer 268 may advantageously reduce a fabrication cost of the microelectronic device 200, because the electroless plating bath 266 does not require the power supply and associated electrical equipment used by electroplating processes.

The component face 242, the I/O pads 214, the UBM layer 262, the copper-containing pillars 216, and the solder balls 218 may be isolated from the electroless plating bath 266 by a polymer coating 270, a carrier plate 272, or a combination of both, as depicted in FIG. 2E.

Figure 2F:
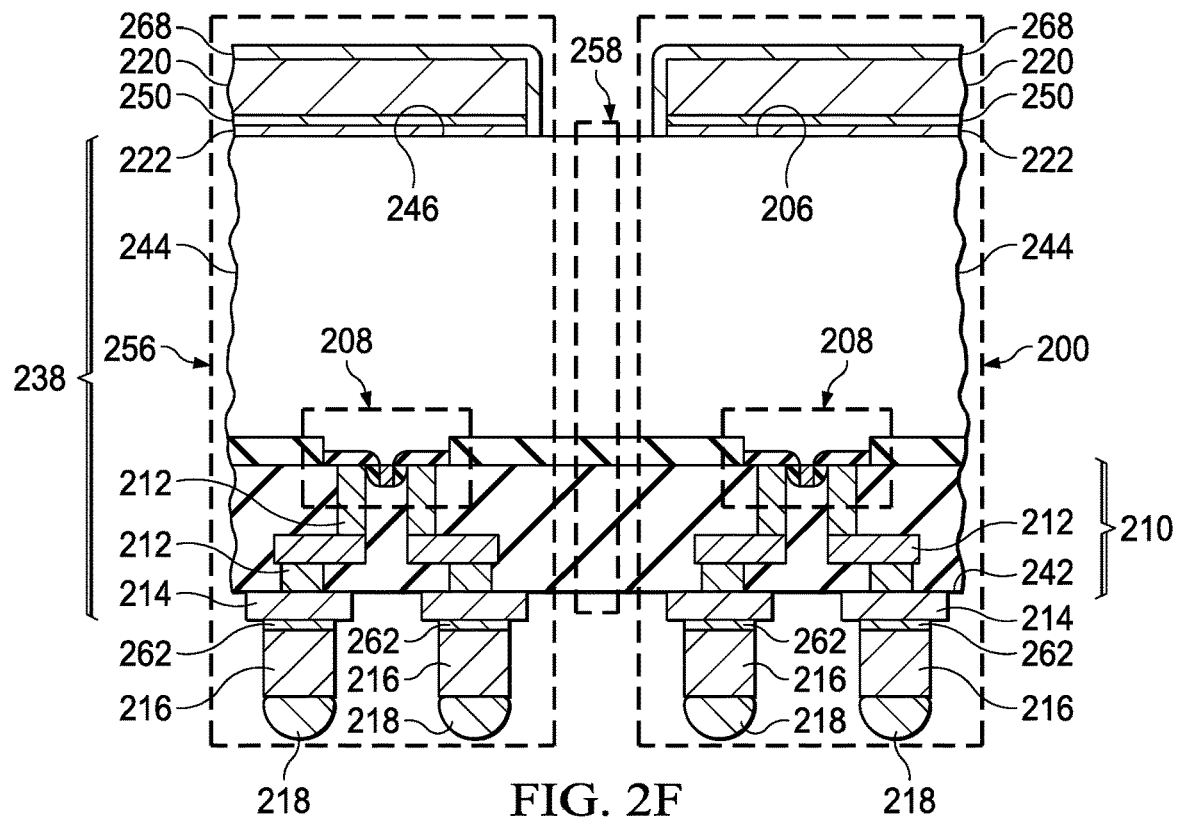

FIG. 2F depicts the substrate wafer 238 with the microelectronic device 200 and the similar microelectronic device 256 after the protective metal layer 268 is formed on the copper-containing layer 220. The protective metal layer 268 may advantageously reduce oxidation, corrosion, or contamination of the copper-containing layer 220 during storage, handling, or processing.

Figure 2G:
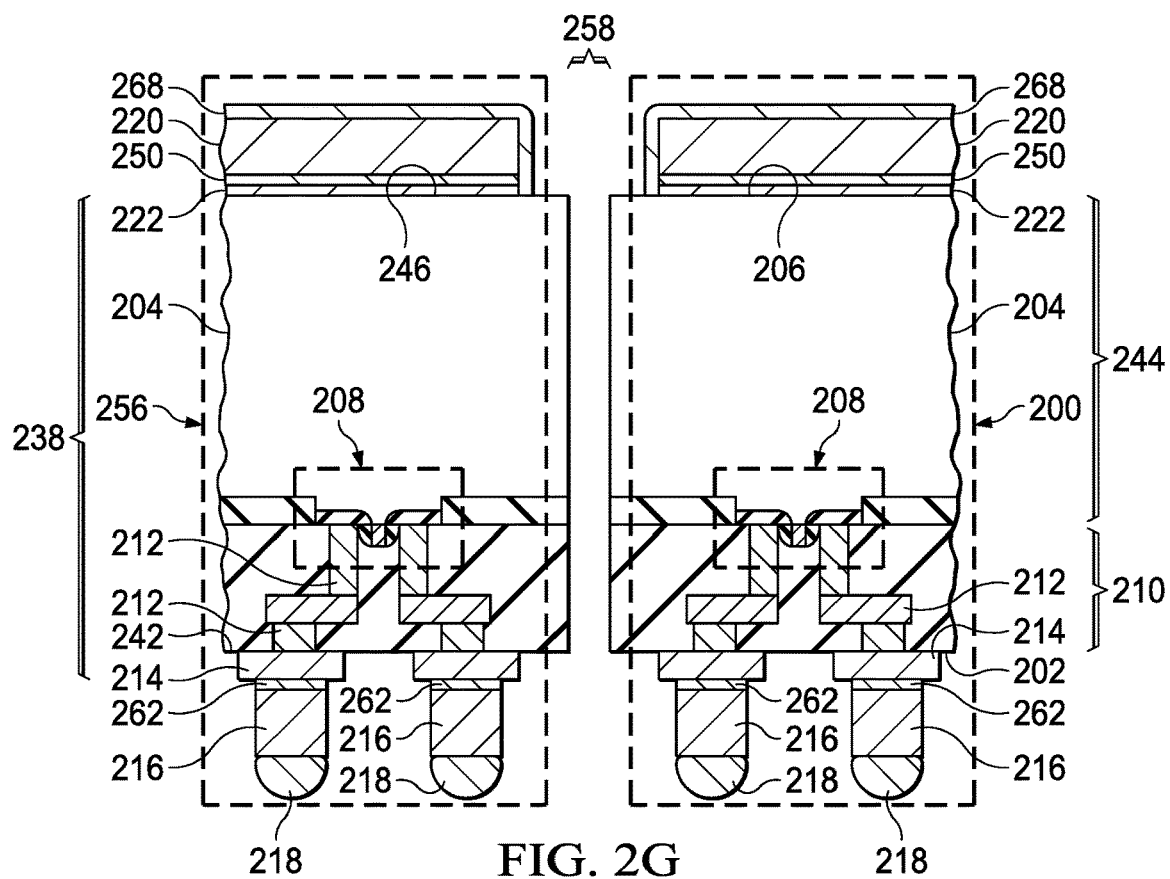

Referring to FIG. 2G, the microelectronic device 200 is singulated from the substrate wafer 238 by a singulation process such as a saw process, a laser scribe process, or a plasma etch singulation process. The singulation process separates the microelectronic device 200 from the adjacent similar microelectronic device 256 by separating the substrate wafer 238 through the singulation region 258. The substrate 244 of the substrate wafer 238 provides a substrate 204 of the singulated microelectronic device 200. The component face 242 of the substrate wafer 238 provides a component surface 202 of the singulated microelectronic device 200, and the die attach face 246 of the substrate wafer 238 provides a die attach surface 206 of the singulated microelectronic device 200. The protective metal layer 268 may advantageously reduce oxidation, corrosion, or contamination of the copper-containing layer 220 during the singulation process.

Figure 2H:
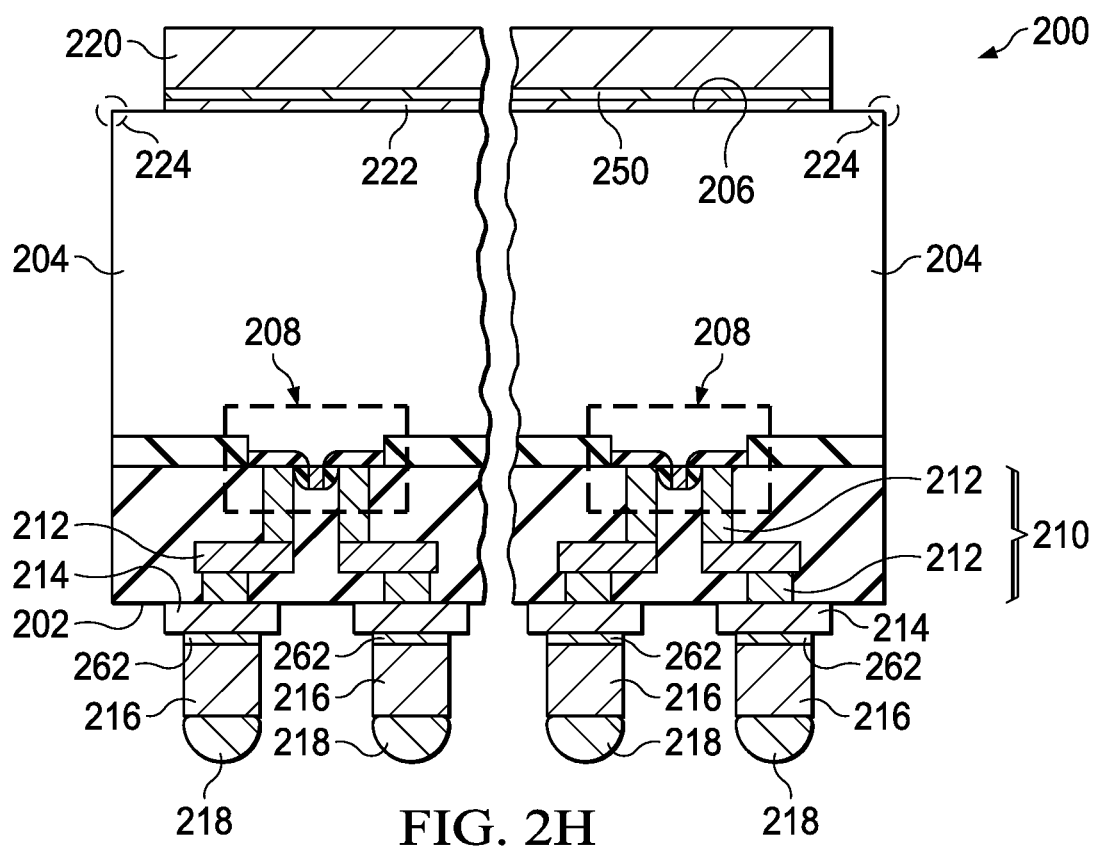

FIG. 2H depicts the singulated microelectronic device 200 immediately prior to assembling the microelectronic device 200 into a package such as a lead frame. The protective metal layer 268 of FIG. 2G may optionally be removed, as depicted in FIG. 2H, leaving the copper-containing layer 220 substantially intact. The protective metal layer 268 may be removed by a wet etch process, or by an electrochemical etch (reverse plating) process, for example. An example wet etch process may use an aqueous solution of nitric acid (at about 20 percent by weight), ferric ion ($Fe^{3+}$, at about 5 percent by weight), copper (at about 1 to 2 grams per liter of the aqueous solution), a suspending agent to keep tin and silver from the protective metal layer 268 in solution, and an inhibitor, also known as an anti-tarnish agent, to reduce oxidation of the copper-containing layer 220. Etch solutions for removing the protective metal layer 268 are commercially available from various suppliers.

The copper-containing layer 220 is recessed from a lateral perimeter 224 of the die attach surface 206, as a result of the plating mask 252 of FIG. 2C overlapping the singulation region 258 of FIG. 2G. The seed layer 250 may also be recessed from the lateral perimeter 224 of the die attach surface 206, as a result of being removed where exposed by the copper-containing layer 220, as disclosed in reference to FIG. 2D.

Figure 2I:
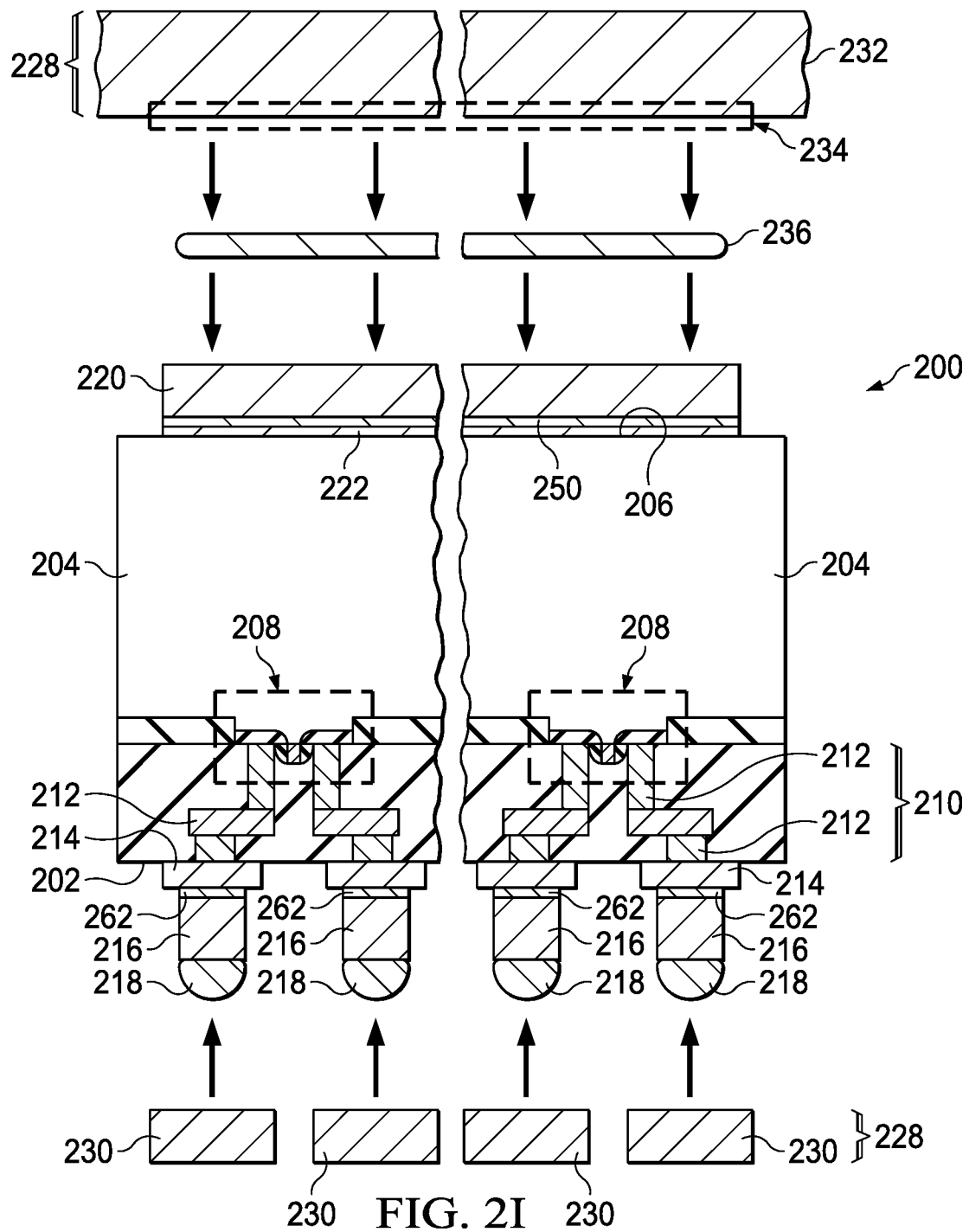

Referring to FIG. 2I, the microelectronic device 200 is assembled into a package 228, which is depicted as a lead frame 228 in FIG. 2I. The lead frame 228 may include leads 230 which are attached to the copper-containing pillars 216 through the solder balls 218, as indicated schematically in FIG. 2I. The lead frame 228 may further include a package member 232, which may be manifested in the instant example as a clip 232, with a package die mount area 234 facing the copper-containing layer 220. The clip 232 may be attached at the package die mount area 234 to the substrate 204 through the seed layer 250, the intermediate layer 222, if present, the copper-containing layer 220, and a die attach material 236, as schematically indicated. In the instant example, the die attach material 236 directly contacts the copper-containing layer 220. The die attach material 236 may be manifested as a solder layer 236. The microelectronic device 200 may be assembled into the package 228 by a solder reflow process which brings the copper-containing layer 220, the solder layer 236, and the clip 232 into contact with each other, and brings the leads 230 into contact with the solder balls 218, and subsequently applies heat to reflow the solder layer 236 and the solder balls 218. Alternatively, the die attach material 236 may be manifested as an adhesive. Protecting the copper-containing layer 220 with the protective metal layer 268 of FIG. 2G may provide a greater thickness and cleaner surface for the copper-containing layer 220, advantageously resulting in a more reliable connection between the substrate 204 and the clip 232, with lower thermal or electrical resistance, compared to using an unprotected copper layer.

Figure 3A:
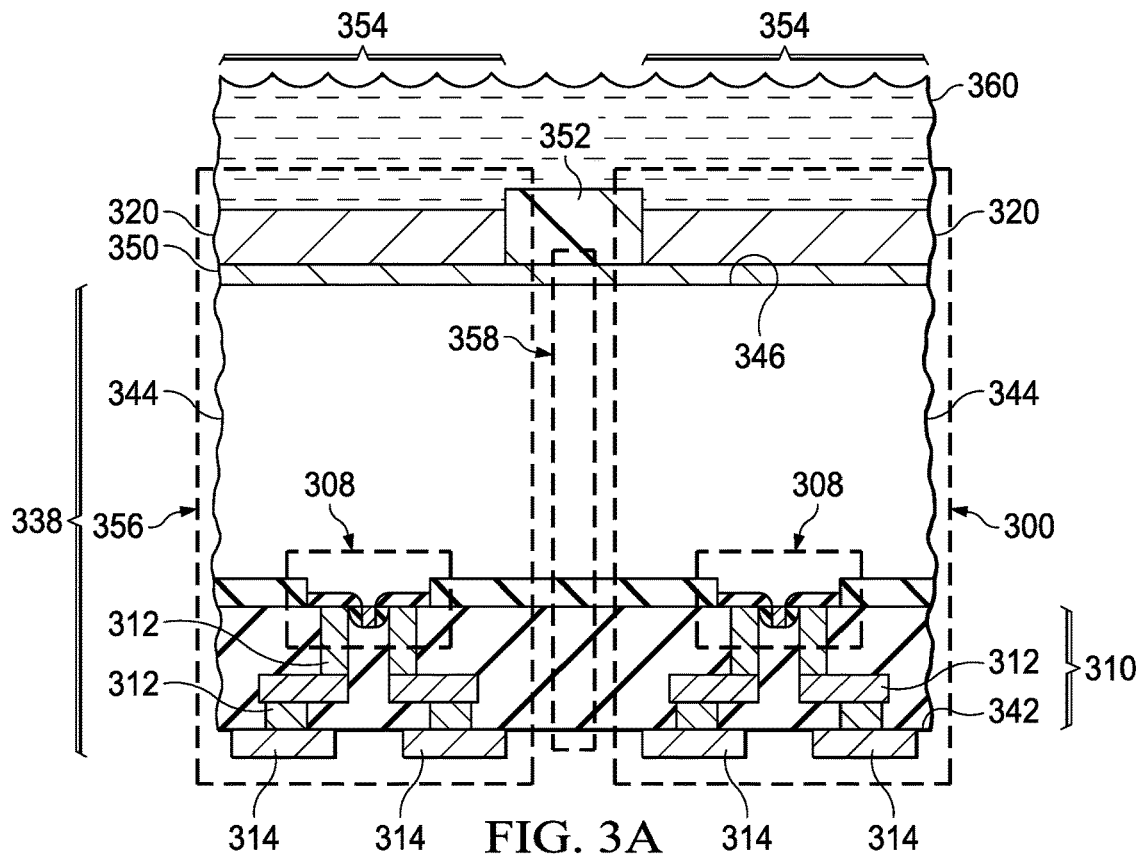
FIG. 3A through FIG. 3H are views of a microelectronic device, depicted in stages of another example method of formation.

FIG. 3A through FIG. 3H are views of a microelectronic device, depicted in stages of another example method of formation. Referring to FIG. 3A, the microelectronic device 300 is contained in a substrate wafer 338. The substrate wafer 338 may be similar to the substrate wafer 238 of FIG. 2A. The substrate wafer 338 has a component face 342, and a substrate 344 of semiconductor material, with a die attach face 346 located opposite from the component face 342. FIG. 3A shows the substrate wafer 338 in cross section at a boundary between the microelectronic device 300 and an adjacent similar microelectronic device 356. Components 308 are formed in the substrate wafer 338 proximate to the component face 342. The microelectronic device 300 and the similar microelectronic device 356 include interconnect regions 310 extending from the components 308 to the component face 342. The microelectronic device 300 and the similar microelectronic device 356 may include interconnection members 312 in the interconnect regions 310 to electrically connect the components 308 to I/O pads 314 located at the component face 342.

The substrate wafer 338 is thinned to a thickness of 10 microns to 300 microns. The substrate wafer 338 may be thinned by removing material from the die attach face 346, for example as described in reference to FIG. 2A. A seed layer 350 is subsequently formed on the die attach face 346, to provide a suitable electrically conductive layer and surface for an electroplating process. The seed layer 350 may include nickel, for example. The seed layer may be formed by a sputter process, or an evaporation process, for example.

A plating mask 352 is formed over the seed layer 350. The plating mask 352 has openings 354 which expose the seed layer 350 in areas for the microelectronic device 300 and the similar microelectronic device 356 contained in the substrate wafer 338. The plating mask 352 covers an area for a singulation region 358 between the areas for the microelectronic device 300 and the similar microelectronic device 356. The plating mask 352 may be formed, for example, by a photolithographic process, or may be formed by an additive process.

The seed layer 350 is exposed to a copper plating bath 360 in the openings 354 in the plating mask 352. A copper-containing layer 320 is formed on the microelectronic device 300 and on the similar microelectronic device 356 where exposed by the plating mask 352 by an electroplating process. The copper plating bath 360 includes copper, and may include additives as disclosed in reference to FIG. 2C. The copper-containing layer 320 may be 5 microns to 10 microns thick, to balance electrical and thermal impedance to the substrate 344 and mechanical stress on the substrate 344.

Figure 3B:
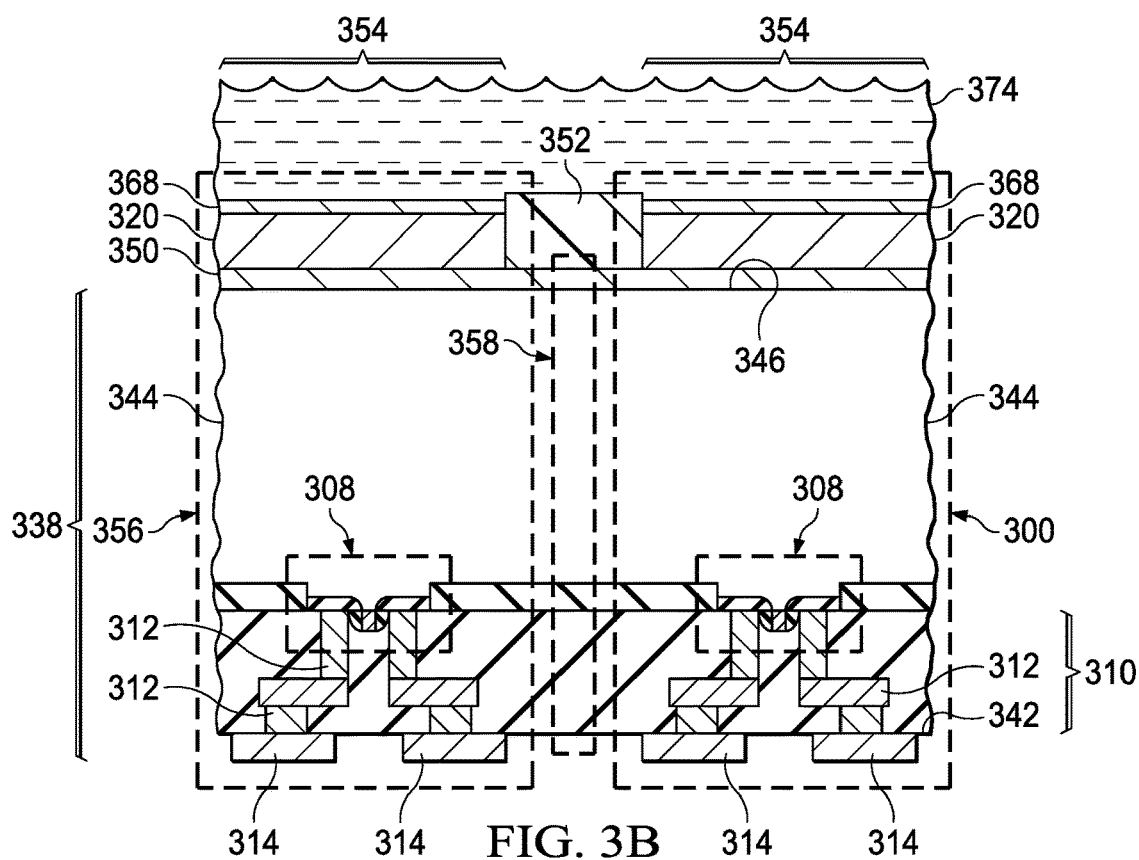

Referring to FIG. 3B, the plating mask 352 is left in place, and the copper-containing layer 320 is exposed to an electroplating bath 374 in the openings 354 in the plating mask 352. A protective metal layer 368 is formed on the copper-containing layer 320 by an electroplating process. The protective metal layer 368 has a composition which protects the copper-containing layer 320 from corrosion or oxidation. The protective metal layer 368 may include tin, silver, nickel, cobalt, tungsten, molybdenum, cerium, lanthanum, or any combination thereof. Particular compositions for the protective metal layer 368 which have been shown to be effective include essentially all tin; tin with a few weight percent silver; essentially all silver; silver with a few weight percent cobalt; essentially all nickel; a combination of nickel and tin; a combination of nickel and silver; nickel with a few weight percent tungsten; essentially all cobalt; a combination of nickel and cobalt; a combination of nickel, cobalt, and tungsten; and a combination of silver and tungsten. Molybdenum may be substituted for a portion or all of tungsten in the protective metal layer 368. Cerium or lanthanum may be added to versions of the protective metal layer 368 which include nickel. The protective metal layer 368 may be 5 microns to 50 microns thick, to provide more protection for the copper-containing layer 320. Forming the protective metal layer 368 using the electroplating bath 374 may enable forming the protective metal layer 368 to a desired thickness with desired process control.

Figure 3C:
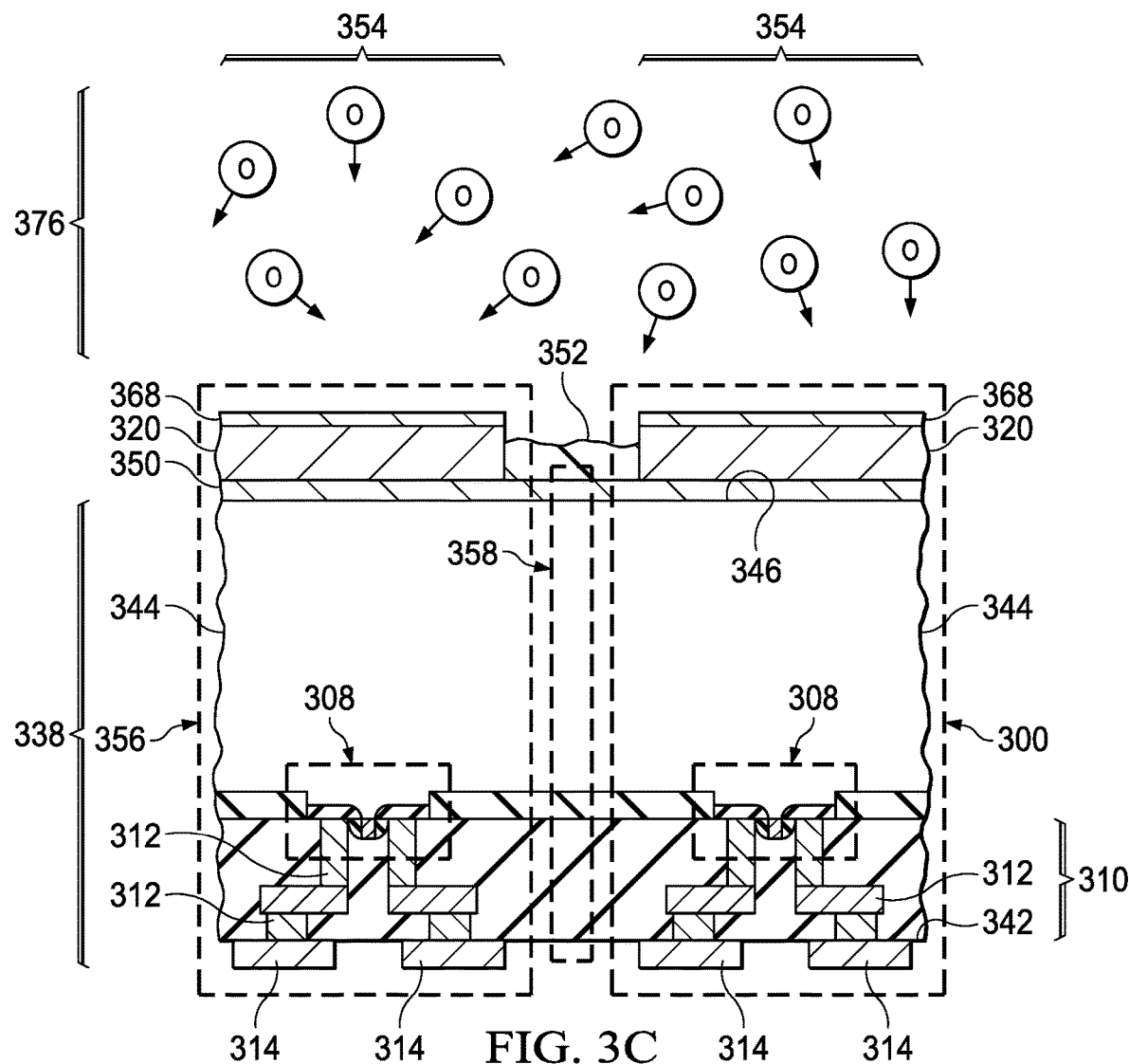

Referring to FIG. 3C, the plating mask 352 is removed. The plating mask 352 may be removed by a plasma process using oxygen radicals 376, as depicted schematically in FIG. 3C. Alternatively, the plating mask 352 may be removed by a wet clean process. A combination of the plasma process using the oxygen radicals 376 and the wet clean process may be used to remove the plating mask 352.

Figure 3D:
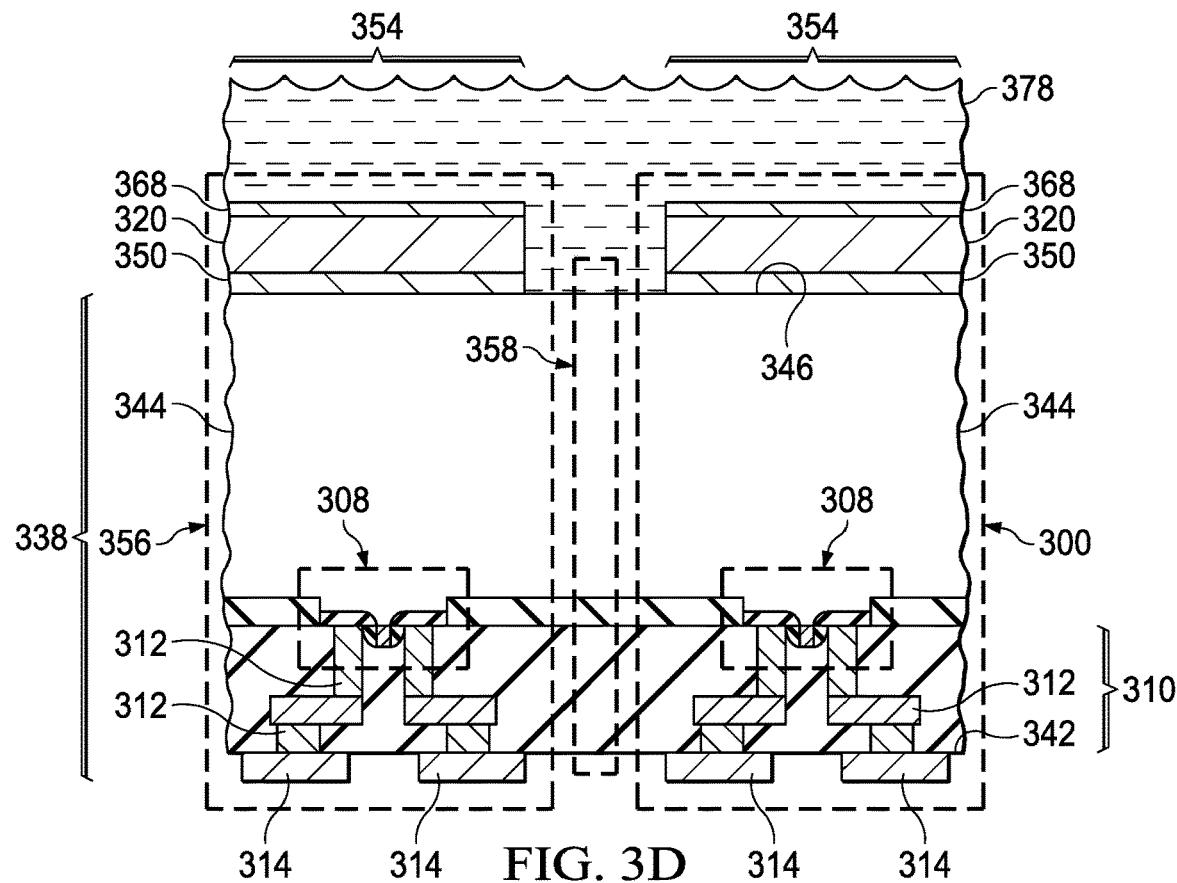

Referring to FIG. 3D, the seed layer 350 may be removed from the area over the singulation region 358. The seed layer 350 may be removed using a wet etch solution 378. The wet etch solution 378 may be formulated to remove the seed layer 350 where exposed by the copper-containing layer 320 without significantly degrading the copper-containing layer 320 or the protective metal layer 368. Alternatively, the seed layer 350 may be removed using a reverse plating process, sometimes referred to as an electropolishing process.

Figure 3E:
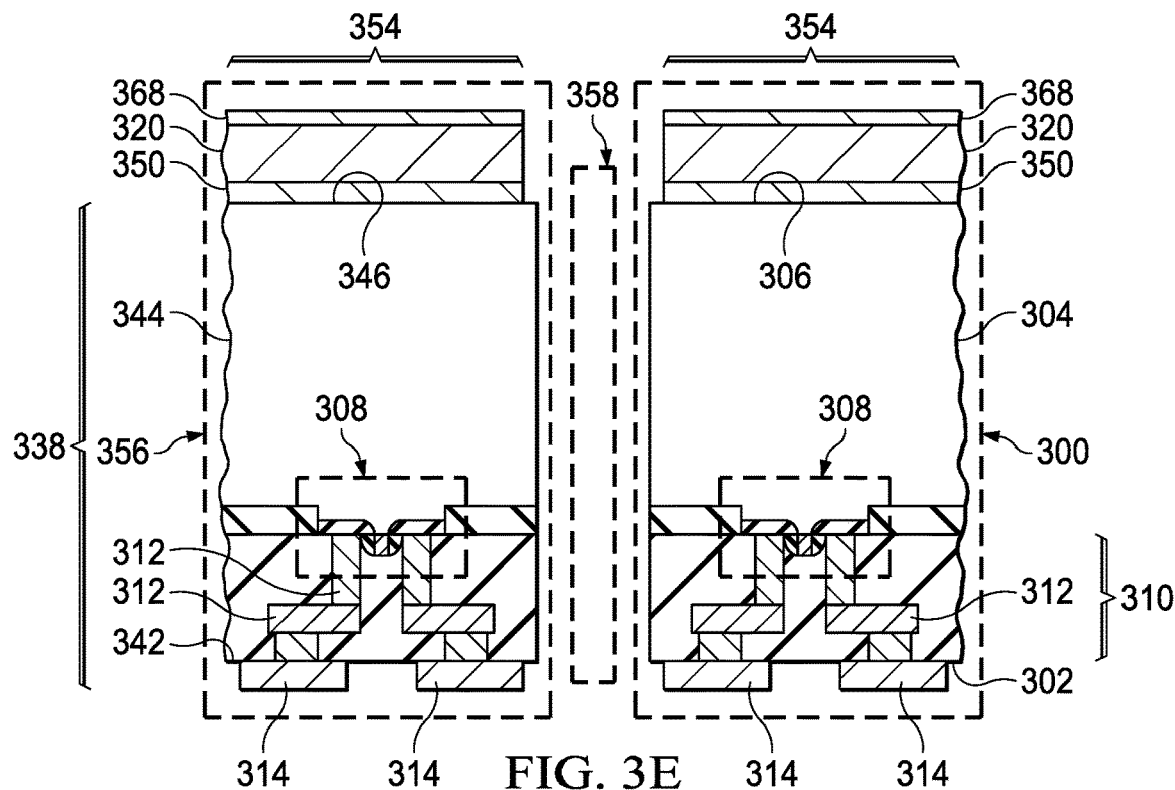

Referring to FIG. 3E, the microelectronic device 300 is singulated from the substrate wafer 338, for example as described in reference to FIG. 2G. The singulation process separates the microelectronic device 300 from the adjacent similar microelectronic device 356 by separating the substrate wafer 338 through the singulation region 358. The substrate 344 of the substrate wafer 338 provides a substrate 304 of the singulated microelectronic device 300. The component face 342 of the substrate wafer 338 provides a component surface 302 of the singulated microelectronic device 300, and the die attach face 346 of the substrate wafer 338 provides a die attach surface 306 of the singulated microelectronic device 300. The protective metal layer 368 may advantageously reduce oxidation, corrosion, or contamination of the copper-containing layer 320 during the singulation process.

Figure 3F:
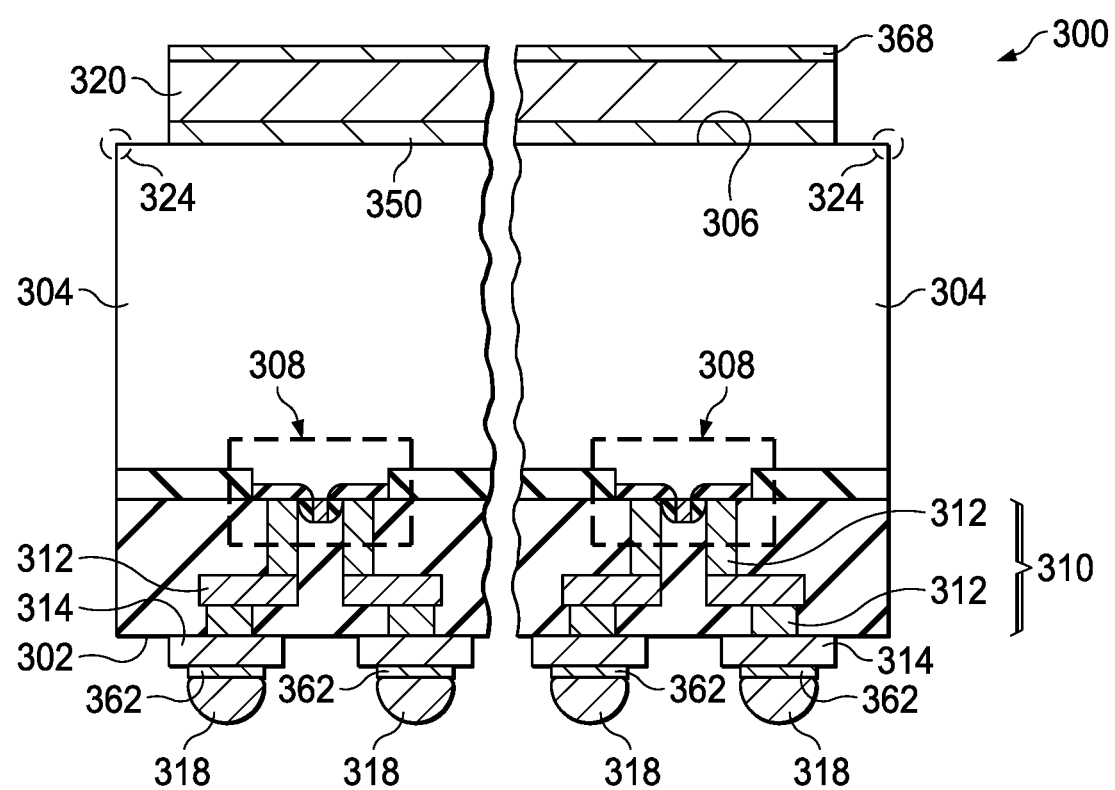

Referring to FIG. 3F, a UBM layer 362 are formed on the I/O pads 314. Solder balls 318 are formed on the UBM layer 362. In an alternate version of the instant example, the UBM layer 362 and the solder balls 318 may be formed prior to the singulation process described in reference to FIG. 3E.

The copper-containing layer 320 is recessed from a lateral perimeter 324 of the die attach surface 306, as a result of the plating mask 352 of FIG. 3A overlapping the singulation region 358 of FIG. 3E. The seed layer 350 may also be recessed from the lateral perimeter 324 of the die attach surface 306, as a result of being removed where exposed by the copper-containing layer 320, as disclosed in reference to FIG. 3E.

Figure 3G:
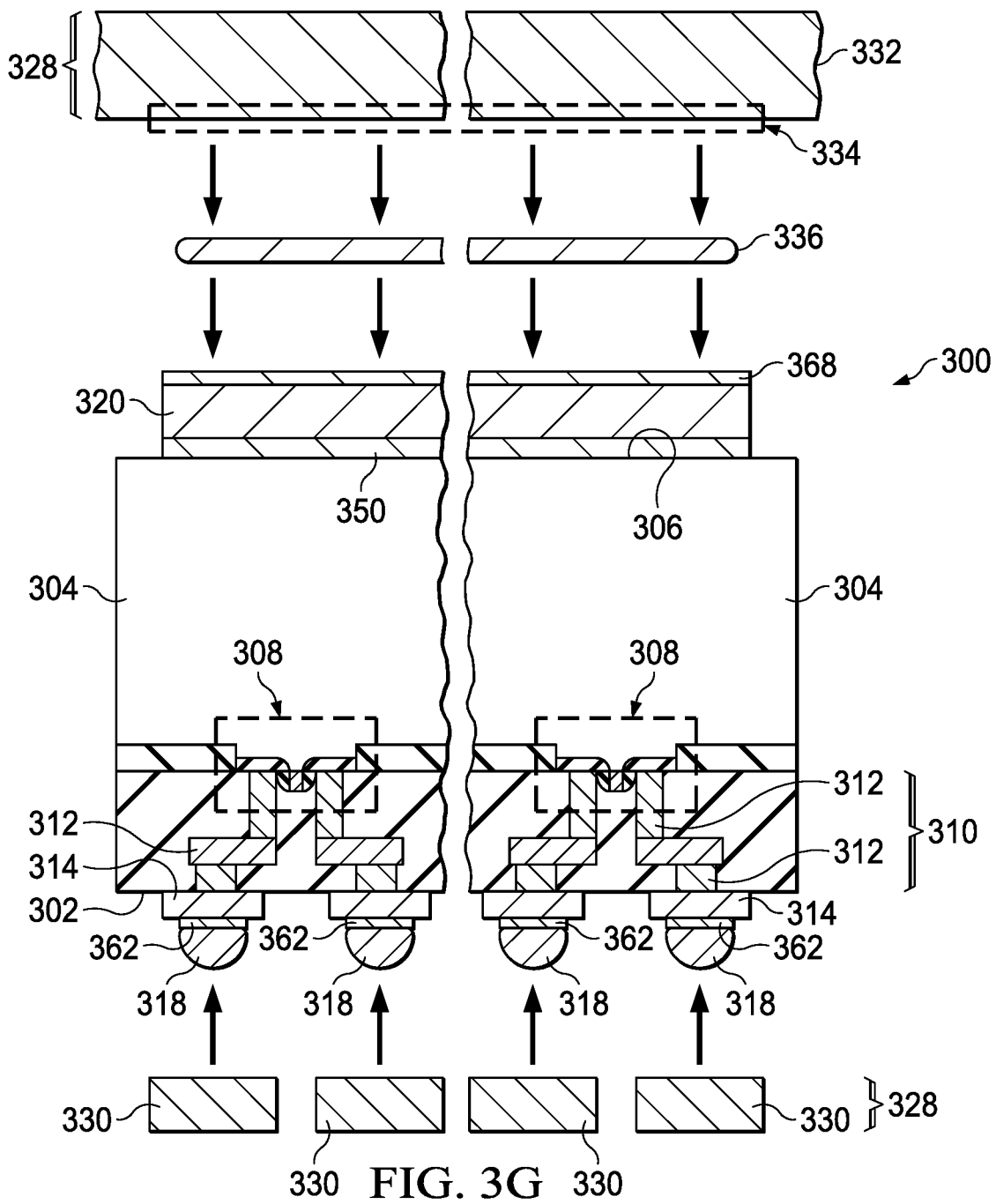

Referring to FIG. 3G, the microelectronic device 300 is assembled into a package 328, which is depicted as a lead frame 328 in FIG. 3G. The lead frame 328 may include leads 330 which are attached to the solder balls 218, as indicated schematically in FIG. 3G. The lead frame 328 may further include a package member 332, such as a clip 332, with a package die mount area 334 facing the copper-containing layer 320. The clip 332 may be attached at the package die mount area 334 to the substrate 304 through the seed layer 350, the copper-containing layer 320, the protective metal layer 368, and a die attach material 336, as schematically indicated. In the instant example, the die attach material 336 directly contacts the protective metal layer 368. The die attach material 336 may be manifested as a solder layer 336, and the microelectronic device 300 may be assembled into the package 328 by a solder reflow process. Alternatively, the die attach material 336 may be manifested as an adhesive. Protecting the copper-containing layer 320 with the protective metal layer 368 may provide desired thickness and uniformity for the copper-containing layer 320, advantageously resulting in a more reliable connection between the substrate 304 and the clip 332, with lower thermal or electrical resistance, compared to using an unprotected copper layer.

Figure 3H:
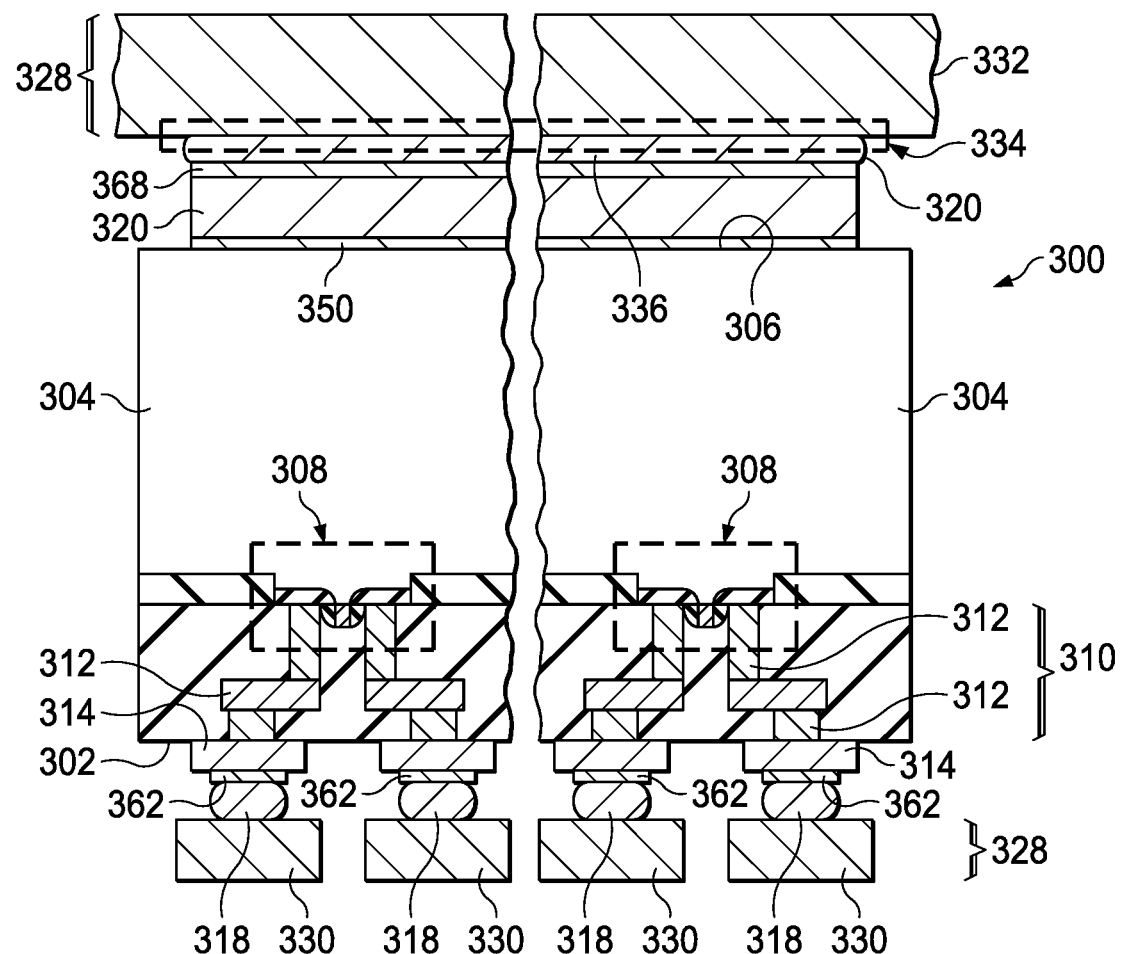

FIG. 3H is a cross section of the microelectronic device 300 after being assembled into the package 328. The solder balls 318 are attached to the leads 330 by a solder reflow process. The solder balls 318 may be attached to the leads 330 concurrently while attaching the protective metal layer 368 to the clip 332. Encapsulation material may be subsequently formed around the microelectronic device 300 to provide protection and electrical isolation.

Figure 4A:
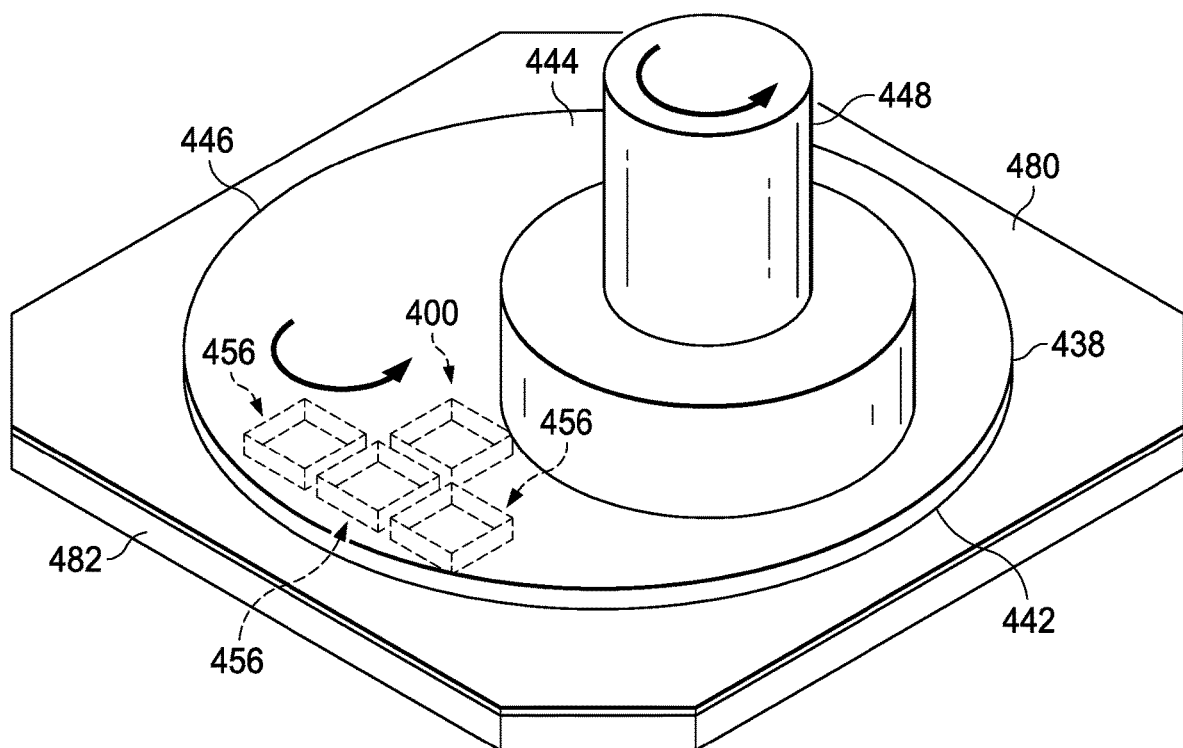
FIG. 4A through FIG. 4F are views of a microelectronic device, depicted in stages of a further example method of formation.

FIG. 4A through FIG. 4F are views of a microelectronic device, depicted in stages of a further example method of formation. Referring to FIG. 4A, the microelectronic device 400 is contained in a substrate wafer 438. The substrate wafer 438 may include similar microelectronic devices 456. The substrate wafer 438 may optionally be mounted on a tape 480 and a tape frame 482. Alternatively, the substrate wafer 438 may be mounted on a carrier plate or may have a protective coating. The substrate wafer 438 has a component face 442 facing the tape 480. The substrate wafer 438 includes a substrate 444 with a die attach face 446 located opposite from the component face 442. The substrate 444 includes a semiconductor material.

Material is removed from the substrate 444 at the die attach face 446 using a backgrind tool 448 in a backgrind operation. The tape 480 protects the component face 442 from contamination during the backgrind operation. The tape 480 and tape frame 482 may be removed after the backgrind operation is completed, or may be left on the substrate wafer 438 to provide mechanical support during subsequent operations.

Figure 4B:
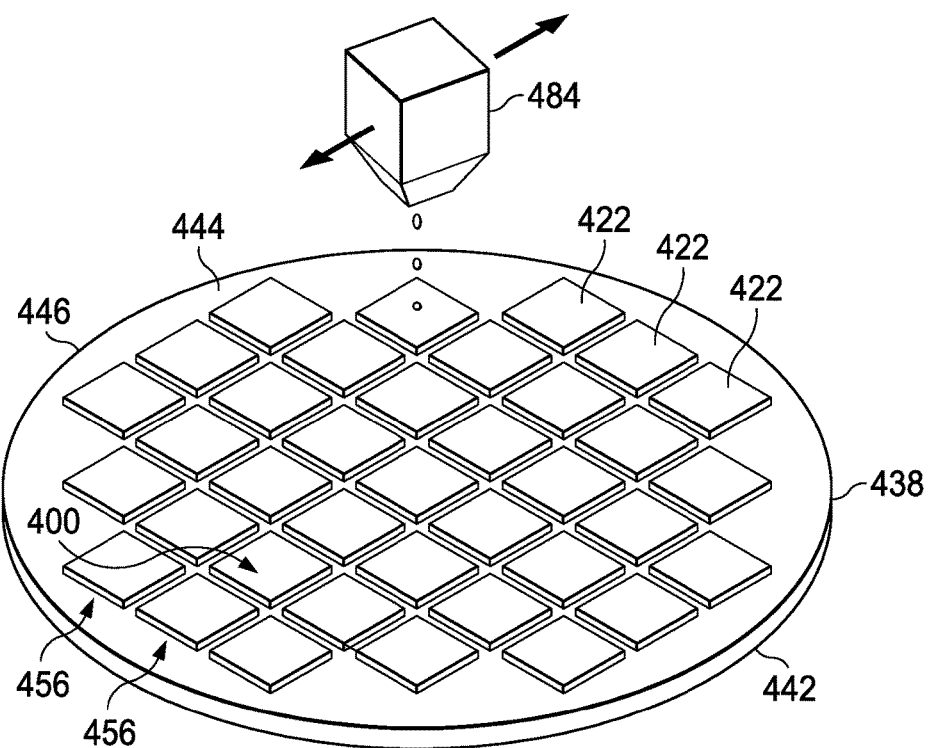

Referring to FIG. 4B, an intermediate layer 422 is formed on the die attach face 446 in areas for the microelectronic device 400 and the similar microelectronic devices 456. In the instant example, the intermediate layer 422 may be formed by a first additive process, such as a material jetting process using a discrete dispensing tool 484, as depicted in FIG. 4B. Other additive processes for forming the intermediate layer 422 are within the scope of the instant example. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired shape of the nanoparticles. Additive processes may enable forming films in desired areas without photolithographic processes and subsequent etch processes, thus advantageously reducing fabrication cost and complexity. Examples of additive processes include binder jetting, directed energy deposition, material extrusion, powder bed fusion, sheet lamination, vat photopolymerization, direct laser deposition, electrostatic deposition, laser sintering, electrochemical deposition, and photo-polymerization extrusion. The intermediate layer 422 may require a heating operation to remove volatile material or to cure binders or adhesives in the intermediate layer 422.

The intermediate layer 422 may be patterned, as depicted in FIG. 4B, to keep singulation regions between the microelectronic device 400 and the similar microelectronic devices 456 free of material which might contaminate the substrate 444 during a subsequent singulation process. Additive processes commonly have fewer steps and are less costly than processes requiring photolithographic operations to form masks to pattern the intermediate layer 422.

The intermediate layer 422 may include material to provide good adhesion, such as titanium, tungsten, or nanoparticles, between the die attach face 446 and a subsequently-formed copper-containing layer 420, depicted in FIG. 4C. The intermediate layer 422 may include material, such as nickel, cobalt, tungsten, or molybdenum, to provide a barrier to copper diffusion from the copper-containing layer 420 into the substrate 444.

The substrate wafer 438 may be handled without a carrier during formation of the intermediate layer 422, as depicted in FIG. 4B. Alternatively, the substrate wafer 438 may be mounted on a tape or carrier plate.

Figure 4C:
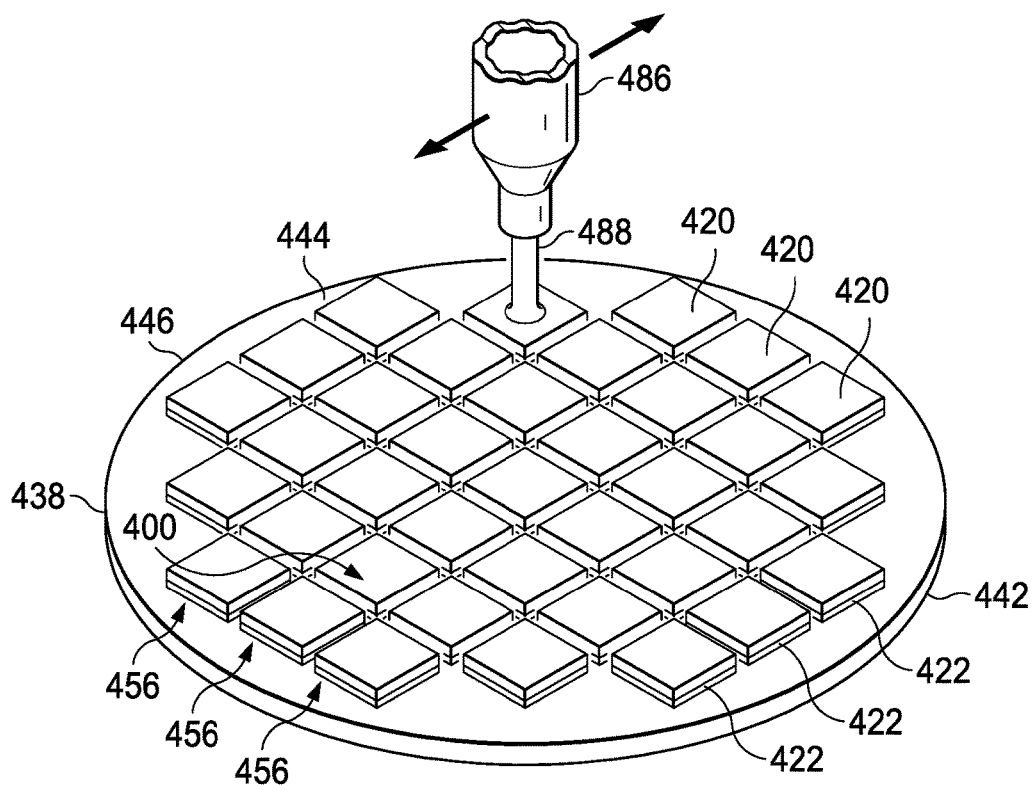

Referring to FIG. 4C, the copper-containing layer 420 is formed on the intermediate layer 422 in the areas for the microelectronic device 400 and the similar microelectronic devices 456. The copper-containing layer 420 may be formed by a second additive process, such as a material extrusion process using a material extrusion tool 486, as depicted in FIG. 4C. The second additive process disposes copper-containing material 488 onto the die attach face 446, directly on the intermediate layer 422, if present. The copper-containing layer 420 may include a continuous layer of copper metal, or may include copper nanoparticles. Depending on a composition and structure of the copper-containing layer 420, the copper-containing layer 420 may have less stress than sputtered copper, and so may be, for example, 10 microns to 25 microns thick, without distorting the substrate wafer 438 to an extent to be incompatible with subsequent fabrication steps. The copper-containing layer 420 may require a heating operation to remove volatile material or to cure binders or adhesives.

The copper-containing layer 420 formed according to the instant example is patterned to keep the singulation regions between the microelectronic device 400 and the similar microelectronic devices 456 free of copper, which might contaminate the substrate 444 during the subsequent singulation process. The second additive process may provide the patterned aspect of the copper-containing layer 420 at a lower cost than a mask and plate operation.

The substrate wafer 438 may be handled without a carrier during formation of the copper-containing layer 420, as depicted in FIG. 4C. Alternatively, the substrate wafer 438 may be mounted on a tape or carrier plate.

Figure 4D:
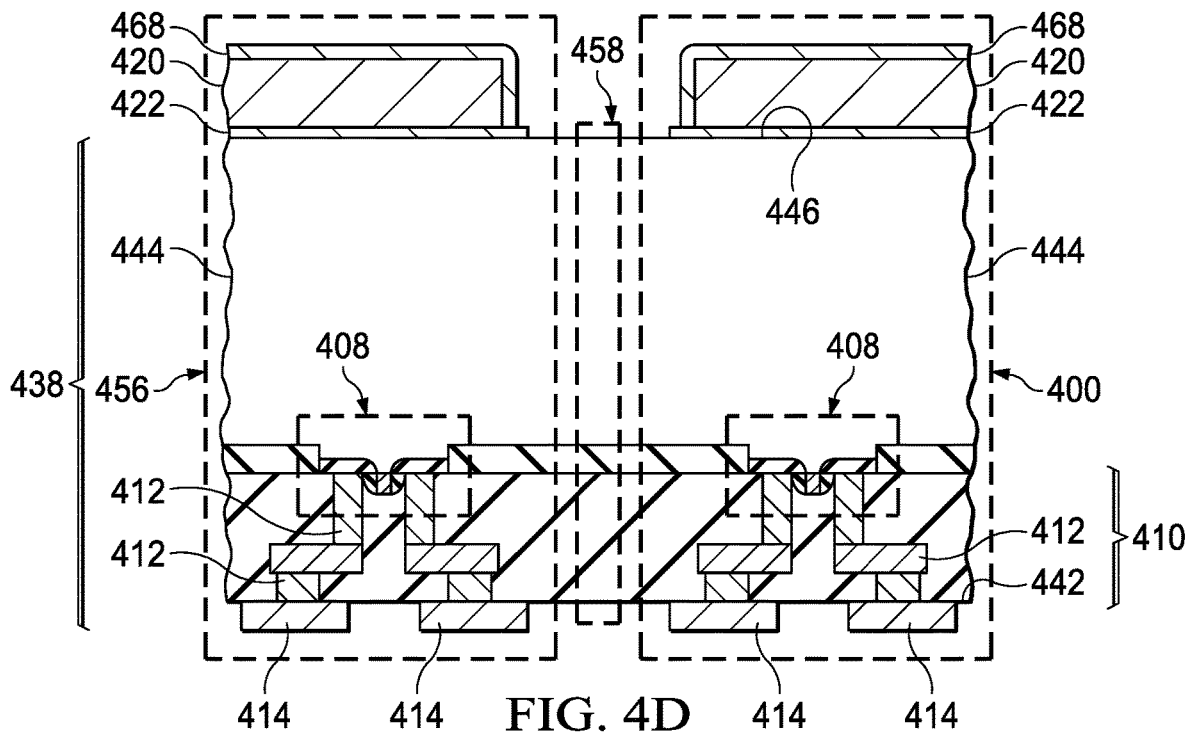

Referring to FIG. 4D, the substrate wafer 438 is shown in cross section at a boundary between the microelectronic device 400 and an adjacent instance of the similar microelectronic devices 456. A singulation region 458 is located between the microelectronic device 400 and the adjacent similar microelectronic device 456. The microelectronic device 400 and the similar microelectronic device 456 include components 408 located proximate to the component face 442, and interconnect regions 410 extending from the components 408 to the component face 442. The microelectronic device 400 and the similar microelectronic device 456 may include interconnection members 412 in the interconnect regions 410 to electrically connect the components 408 to I/O pads 414 located at the component face 442. In the instant example, the I/O pads 414 may be manifested as wire bond pads 414.

The intermediate layer 422 may be recessed from the singulation region 458, as depicted in FIG. 4D. The copper-containing layer 420 may be recessed from the singulation region 458, and may further be recessed from a lateral perimeter of the intermediate layer 422, as depicted in FIG. 4D. Recessing the intermediate layer 422 and the copper-containing layer 420 may advantageously reduce contamination from metals in the intermediate layer 422 and the copper-containing layer 420 into the substrate 444 during a subsequent singulation process which separates the microelectronic device 400 from the adjacent similar microelectronic device 456.

A protective metal layer 468 is formed on the copper-containing layer 420. The protective metal layer 468 may include, for example, tin, silver, nickel, cobalt, tungsten, molybdenum, cerium, lanthanum, or any combination thereof. The protective metal layer 468 may be formed by an immersion plating process, for example, as disclosed in reference to FIG. 2E, or by an electroplating process, for example as disclosed in reference to FIG. 3B. The protective metal layer 468 may be, for example, 0.5 microns to 2 microns thick. The protective metal layer 468 does not extend into the singulation region 458, as depicted in FIG. 4D.

After the protective metal layer 468 is formed, the microelectronic device 400 is singulated from the substrate wafer 438 by a singulation process. The singulation process separates the microelectronic device 400 from the adjacent similar microelectronic device 456 through the singulation region 458. The protective metal layer 468 may advantageously protect the copper-containing layer 420 from corrosion or contamination during the singulation process.

Figure 4E:
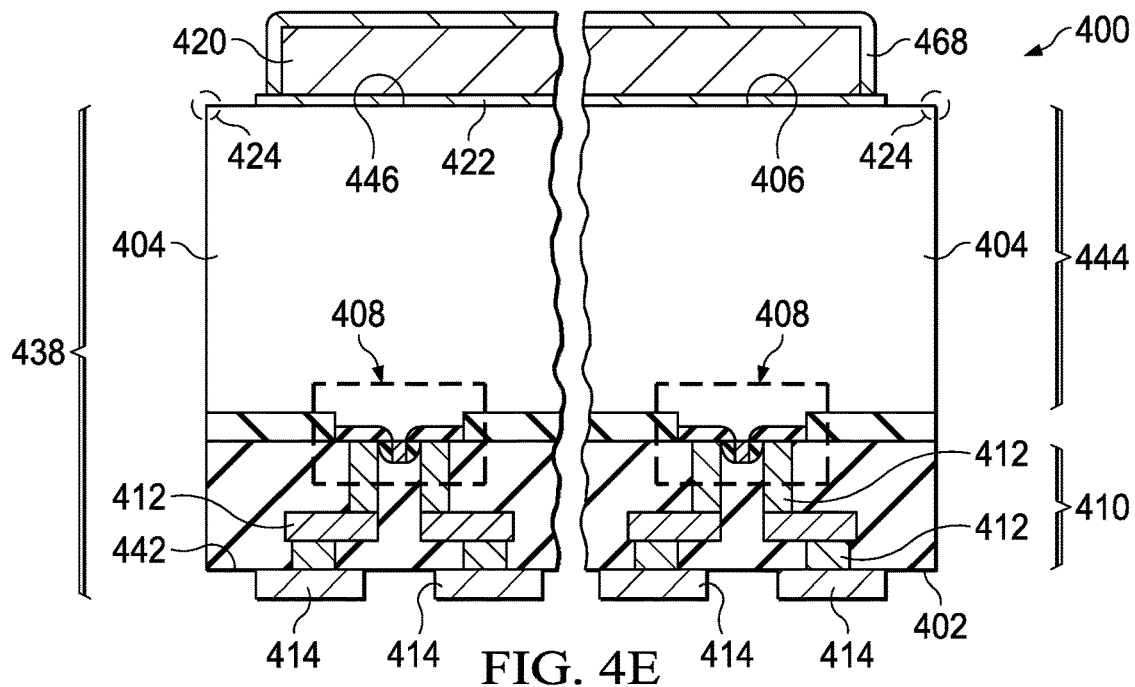

FIG. 4E depicts the microelectronic device 400 after the singulation process. The substrate 444 of the substrate wafer 438 provides a substrate 404 of the singulated microelectronic device 400. The component face 442 of the substrate wafer 438 provides a component surface 402 of the singulated microelectronic device 400, and the die attach face 446 of the substrate wafer 438 provides a die attach surface 406 of the singulated microelectronic device 400. In the instant example, the protective metal layer 468 may be left on the copper-containing layer 420 during a subsequent assembly process. The copper-containing layer 420 may be recessed from a lateral perimeter 424 of the die attach surface 406, as a result of performing the second additive process, disclosed in reference to FIG. 4C, so as to keep the singulation regions between the microelectronic device 400 and the similar microelectronic devices 456 of FIG. 2C free of copper.

Figure 4F:
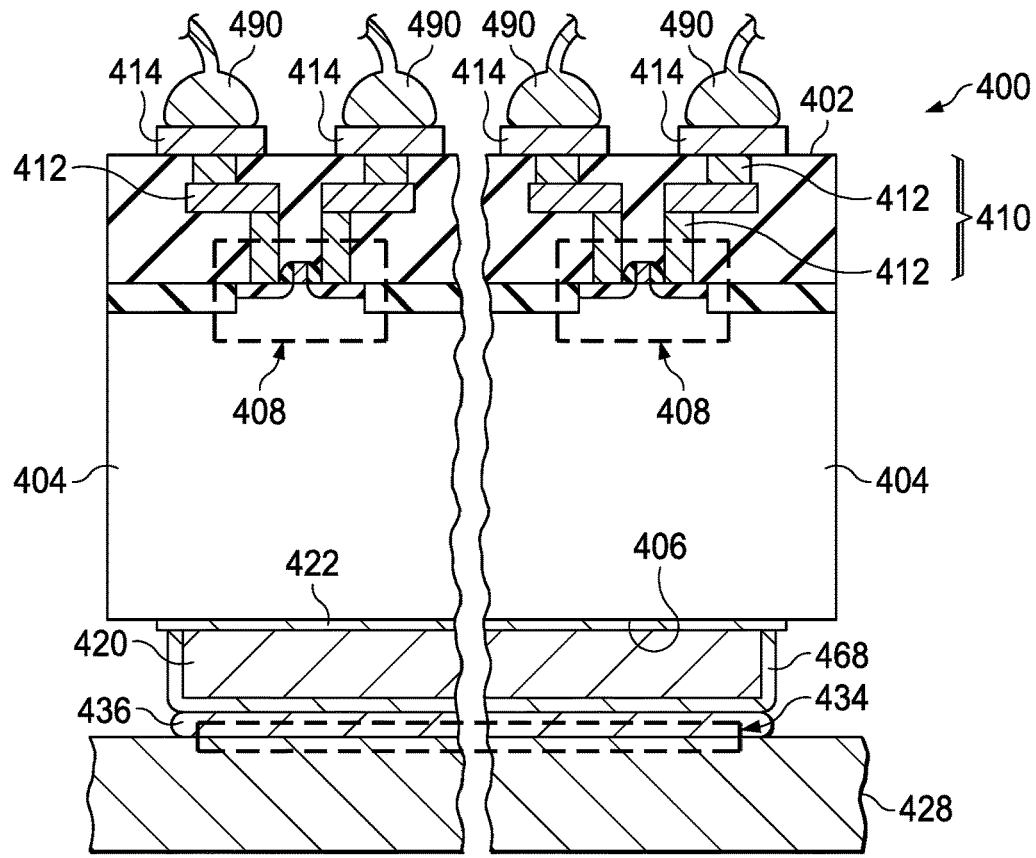

Referring to FIG. 4F, the microelectronic device 400 is assembled onto a package member 428, which may be manifested in the instant example as a header 428. The header 428 has a package die mount area 434 for attaching the microelectronic device 400.

The header 428 may be attached at the package die mount area 434 to the substrate 404 through the intermediate layer 422, the copper-containing layer 420, the protective metal layer 468, and a solder layer 436, as schematically indicated. The microelectronic device 400 may be assembled onto the header 428 by a solder reflow process which brings the protective metal layer 468 into contact with the solder layer 436, and brings the solder layer 436 into contact with the header 428, and subsequently applies heat to reflow the solder layer 436. A portion of the protective metal layer 468 may be absorbed into the solder layer 436 during the reflow process. Protecting the copper-containing layer 420 with the protective metal layer 468 may provide a greater thickness for the copper-containing layer 420, advantageously resulting in a more reliable connection between the substrate 404 and the header 428, with lower thermal or electrical resistance, compared to using an unprotected copper layer.

Wire bonds 490 may be formed on the wire bond pads 414 to provide electrical connections to the components 408. The wire bonds 490 may be formed after the header 428 is attached to the substrate 404.

Various features of the examples disclosed herein may be combined in other manifestations of example microelectronic devices. For example, the sputter process for forming the intermediate layer 222 may be used in place of the first additive process for forming the intermediate layer 422, and vice versa. Similarly, the plating process for forming the copper-containing layer 220 may be used in place of the second additive process for forming the copper-containing layer 420, and vice versa. The microelectronic device 200 may have wire bond pads in place of the copper-containing pillars 216 and solder balls 218. Similarly, the microelectronic device 400 may have copper-containing pillars and solder balls in place of the wire bond pads 414.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:
1. A microelectronic device, comprising:
   a substrate having a component surface and a die attach surface located opposite from the component surface;
   components located proximate to the component surface;
   a copper-containing layer on the die attach surface, the copper-containing layer being recessed from a lateral perimeter of the die attach surface in its entirety from a bottom view of the microelectronics device; and
   a die attach material on the copper-containing layer, wherein the copper-containing layer is attached to a package member by the die attach material.
2. The microelectronic device of claim 1, wherein the copper-containing layer is 5 microns to 10 microns thick.
3. The microelectronic device of claim 1, further comprising an intermediate layer between the copper-containing layer and the die attach surface.
4. The microelectronic device of claim 3, wherein the intermediate layer includes titanium.
5. The microelectronic device of claim 1, further comprising a protective metal layer between the copper-containing layer and the die attach material, the protective metal layer including at least one metal selected from the group consisting of tin, silver, and nickel.
6. The microelectronic device of claim 1, wherein the die attach material includes solder.
7. The microelectronic device of claim 1, wherein the substrate is 15 microns to 300 microns thick.
8. A method of forming a microelectronic device, comprising:
   providing a substrate wafer having a component face and a die attach face located opposite from the component face, the substrate wafer including components of the microelectronic device proximate to the component face;
   removing material from the substrate wafer at the die attach face;

forming a copper-containing layer on the die attach face, wherein the copper-containing layer is recessed in its entirety from a lateral perimeter of an area for the microelectronic device; and forming a protective metal layer on the copper-containing layer by a plating process.

9. The method of claim 8, wherein the protective metal layer includes at least one metal selected from the group consisting of tin, silver, and nickel.

10. The method of claim 8, wherein:
a thickness of the substrate wafer is greater than 300 microns prior to removing the material from the substrate wafer; and
the thickness of the substrate wafer is less than 300 microns after removing the material from the substrate wafer.

11. The method of claim 8, wherein forming the copper-containing layer includes:
forming a seed layer on the die attach face;
forming a plating mask on the seed layer, the seed layer exposing an area for the copper-containing layer;
plating copper on the seed layer where exposed by the plating mask by a plating process; and
removing the plating mask.

12. The method of claim 11, wherein the copper-containing layer is 5 microns to 10 microns thick.

13. The method of claim 11, further comprising forming at least a portion of copper-containing pillars on the component face concurrently with forming the copper-containing layer.

14. The method of claim 8, wherein forming the copper-containing layer includes an additive process which disposes copper-containing material onto the die attach face.

15. The method of claim 8, further comprising forming an intermediate layer on the die attach face after removing the material from the substrate wafer and prior to forming the copper-containing layer, wherein the copper-containing layer is formed on the intermediate layer.

16. A method of forming a microelectronic device, comprising:
providing a substrate less than 300 microns thick, the substrate having a component surface and a die attach surface located opposite from the component surface, the substrate including components proximate to the component surface, the substrate having a copper-containing layer on the die attach surface, wherein the copper-containing layer is recessed from a lateral perimeter of the die attach surface in its entirety from a bottom view of the microelectronic device, the substrate having a protective metal layer on the copper-containing layer, wherein the copper-containing layer is between the die attach surface and the protective metal layer; and
attaching the substrate to a package member with a die attach material, wherein the copper-containing layer is attached to the package member by the die attach material.

17. The method of claim 16, further comprising removing the protective metal layer prior to attaching the substrate to the package member.

18. The method of claim 16, wherein the copper-containing layer is 5 microns to 10 microns thick.

19. The method of claim 16, wherein the die attach material includes solder.

20. The method of claim 19, wherein attaching the substrate to the package member includes a solder reflow process.

* * * * *